(12) United States Patent
Sakui

(10) Patent No.: US 10,090,024 B2
(45) Date of Patent: Oct. 2, 2018

(54) MEMORY DEVICE INCLUDING CURRENT GENERATOR PLATE

(71) Applicant: Micron Technology, Inc., Boise, ID (US)

(72) Inventor: Koji Sakui, Setagayaku (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/844,007

(22) Filed: Dec. 15, 2017

(65) Prior Publication Data

US 2018/0108385 A1    Apr. 19, 2018

Related U.S. Application Data

(62) Division of application No. 15/205,640, filed on Jul. 8, 2016, now Pat. No. 9,865,311.

(51) Int. Cl.
| | | |
|---|---|---|
| *G11C 11/34* | (2006.01) | |
| *G11C 5/14* | (2006.01) | |
| *H01L 27/24* | (2006.01) | |
| *H01L 27/105* | (2006.01) | |
| *H01L 27/115* | (2017.01) | |

(Continued)

(52) U.S. Cl.
CPC ............ *G11C 5/147* (2013.01); *G11C 7/00* (2013.01); *H01L 27/1052* (2013.01); *H01L 27/115* (2013.01); *H01L 27/2463* (2013.01); *G11C 11/34* (2013.01); *G11C 16/10* (2013.01)

(58) Field of Classification Search
CPC .................................................... G11C 11/34
USPC ................................................... 365/185.18
See application file for complete search history.

(56) References Cited

U.S. PATENT DOCUMENTS

| | | | |
|---|---|---|---|
| 7,352,625 B2 | 4/2008 | Futatsuyama et al. | |
| 8,879,331 B2 | 11/2014 | Sel et al. | |
| 8,975,148 B2 | 3/2015 | Pellizzer | |

(Continued)

FOREIGN PATENT DOCUMENTS

| | | |
|---|---|---|
| TW | 201805940 A | 2/2018 |
| WO | WO-2018009326 A1 | 1/2018 |

OTHER PUBLICATIONS

"International Application Serial No. PCT/US2017/037716, International Search Report dated Sep. 26, 2017", 3 pgs.

(Continued)

*Primary Examiner* — Jason Lappas
(74) *Attorney, Agent, or Firm* — Schwegman Lundberg & Woessner, P.A.

(57) ABSTRACT

Some embodiments include an apparatus and methods using a first conductive material located in a first level of an apparatus (e.g., a memory device); a second conductive material located in a second level of the apparatus; pillars extending between the first and second levels and contacting the first and second conductive materials; memory cells located along the pillars; first select gates located in a third level of the apparatus between the first and second levels, with each of the first select gates being located along a segment of a respective pillar among the pillars; second select gates located in a fourth level of the apparatus between the first and third levels; and a conductive plate located in a fifth level of the apparatus between the first and fourth levels, with each of the pillars extending through the conductive plate.

20 Claims, 24 Drawing Sheets

(51) Int. Cl.
*G11C 7/00* (2006.01)
*G11C 16/10* (2006.01)

(56) References Cited

U.S. PATENT DOCUMENTS

| | | | |
|---|---|---|---|
| 9,412,463 | B1 | 8/2016 | Chen et al. |
| 9,728,266 | B1 | 8/2017 | Goda et al. |
| 9,865,311 | B1 | 1/2018 | Sakui |
| 2007/0075359 | A1 | 4/2007 | Yoon et al. |
| 2007/0252201 | A1 | 11/2007 | Kito et al. |
| 2008/0186771 | A1 | 8/2008 | Katsumata et al. |
| 2008/0198660 | A1 | 8/2008 | Mokhlesi |
| 2009/0161439 | A1 | 6/2009 | Aiika et al. |
| 2010/0195395 | A1 | 8/2010 | Jeong et al. |
| 2011/0170358 | A1 | 7/2011 | Chen et al. |
| 2011/0205802 | A1 | 8/2011 | Choe et al. |
| 2012/0051143 | A1 | 3/2012 | Yoon et al. |
| 2012/0091521 | A1 | 4/2012 | Goda |
| 2012/0098049 | A1 | 4/2012 | Moon et al. |
| 2012/0223382 | A1 | 9/2012 | Joo et al. |
| 2012/0241844 | A1 | 9/2012 | Iguchi et al. |
| 2012/0314514 | A1 | 12/2012 | Kwon et al. |
| 2013/0044531 | A1 | 2/2013 | Baek et al. |
| 2013/0051150 | A1 | 2/2013 | Roizin et al. |
| 2013/0105876 | A1 | 5/2013 | Hwang |
| 2013/0148427 | A1 | 6/2013 | Lee |
| 2013/0308387 | A1* | 11/2013 | Tanzawa ............ G11C 16/0483 365/185.18 |
| 2013/0328005 | A1 | 12/2013 | Shin |
| 2014/0063890 | A1 | 3/2014 | Lee et al. |
| 2014/0291747 | A1 | 10/2014 | Simsek-ege et al. |
| 2015/0001460 | A1 | 1/2015 | Kim |
| 2015/0054058 | A1 | 2/2015 | Seol |
| 2015/0206898 | A1 | 7/2015 | Chen |
| 2015/0303209 | A1 | 10/2015 | Park et al. |
| 2016/0012893 | A1 | 1/2016 | Ahn et al. |
| 2016/0054953 | A1 | 2/2016 | Lee |
| 2016/0055913 | A1 | 2/2016 | Lee et al. |
| 2016/0071870 | A1 | 3/2016 | Minami et al. |
| 2016/0141337 | A1 | 5/2016 | Shimabukuro et al. |
| 2016/0247570 | A1 | 8/2016 | Chang et al. |
| 2018/0012634 | A1 | 1/2018 | Sakui |
| 2018/0012660 | A1 | 1/2018 | Goda et al. |

OTHER PUBLICATIONS

"International Application Serial No. PCT/US2017/037716, Written Opinion dated Sep. 26, 2017", 10 pgs.

"Taiwanese Application Serial No. 106121939, Office Action dated Jan. 22, 2018", w/ English Translation, 31 pgs.

* cited by examiner

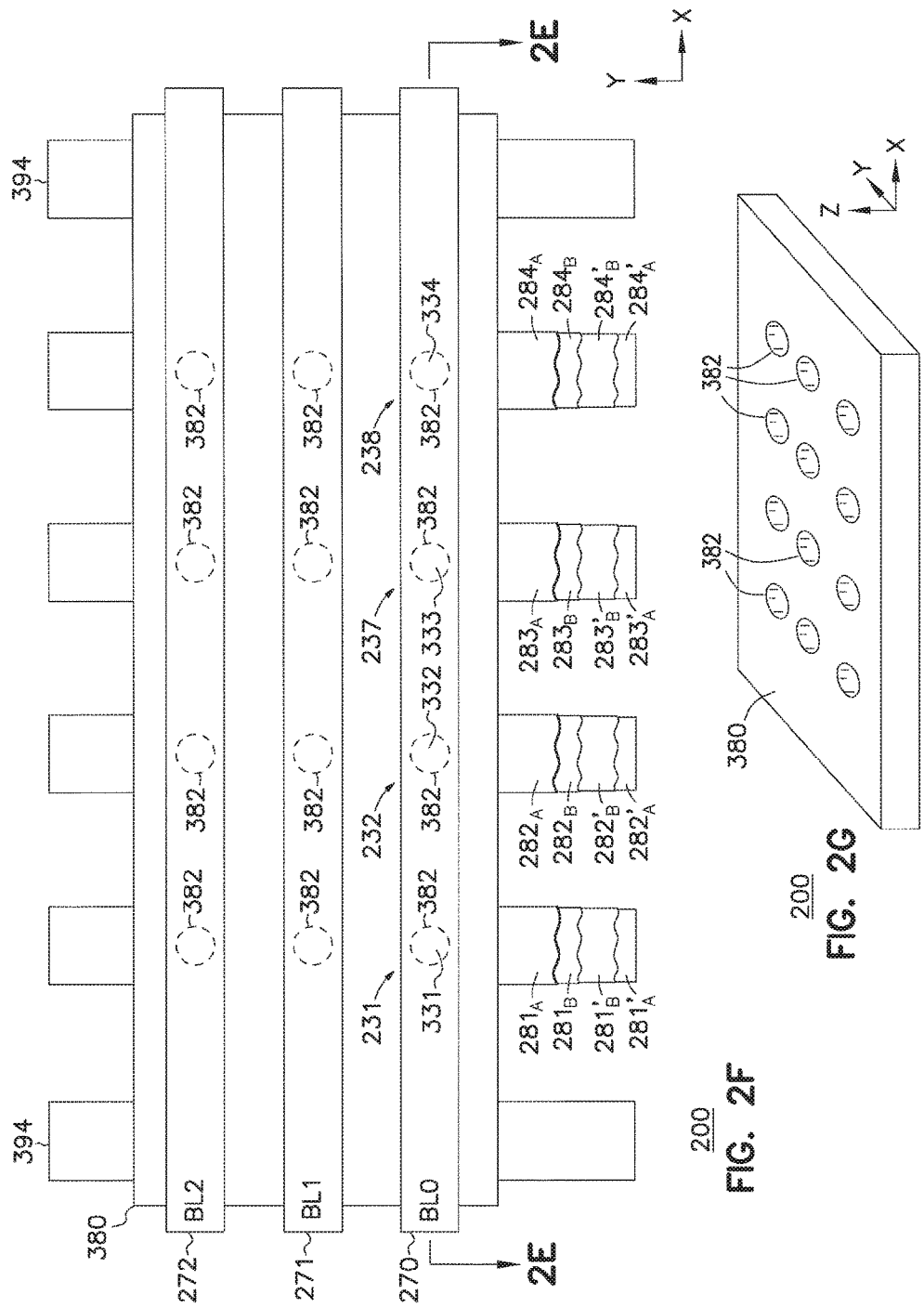

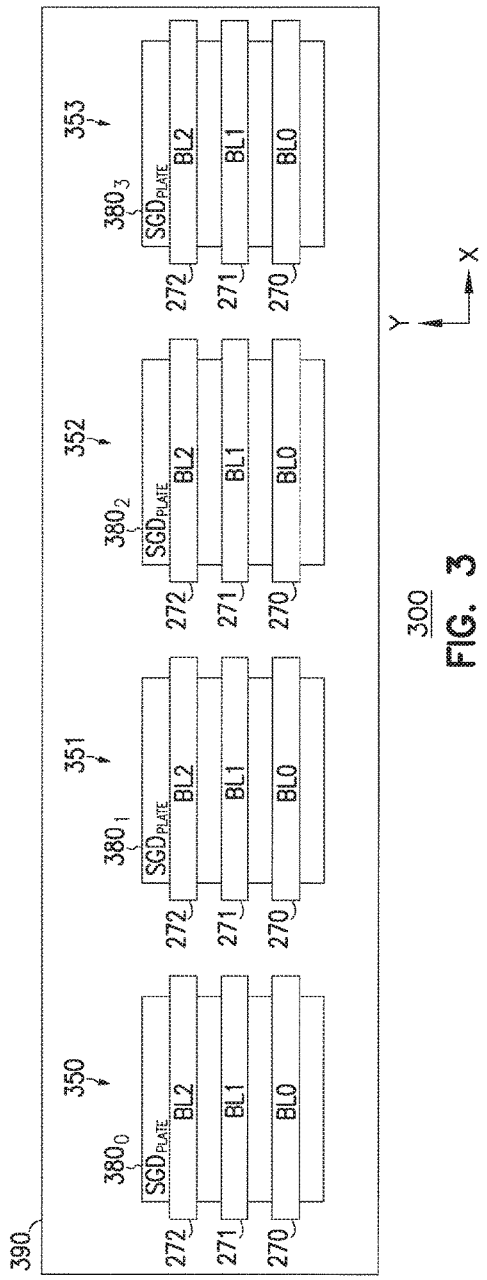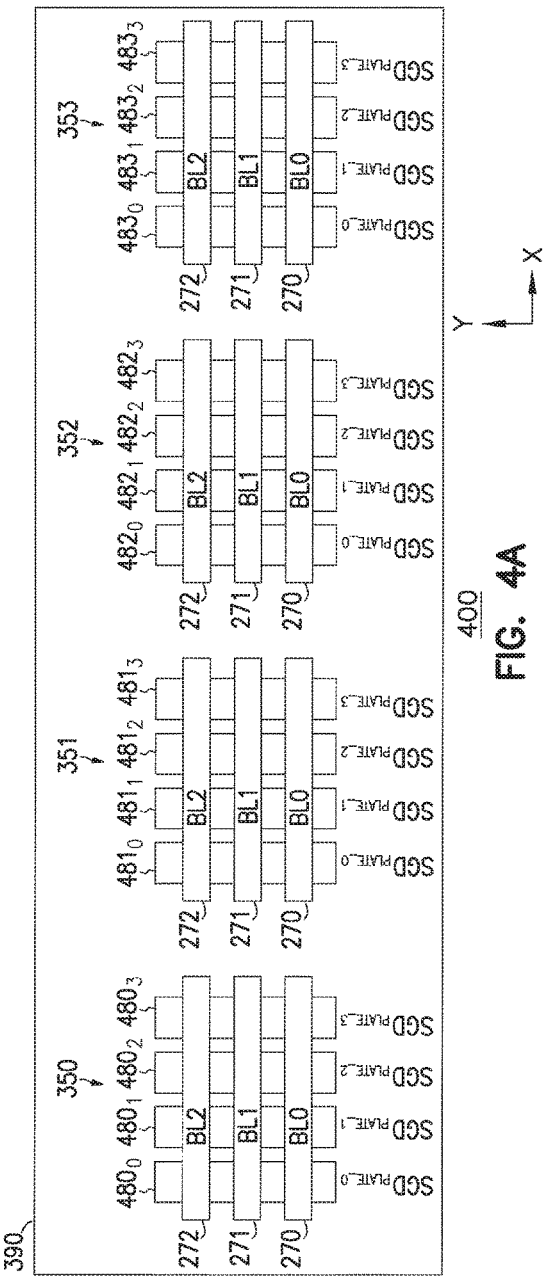

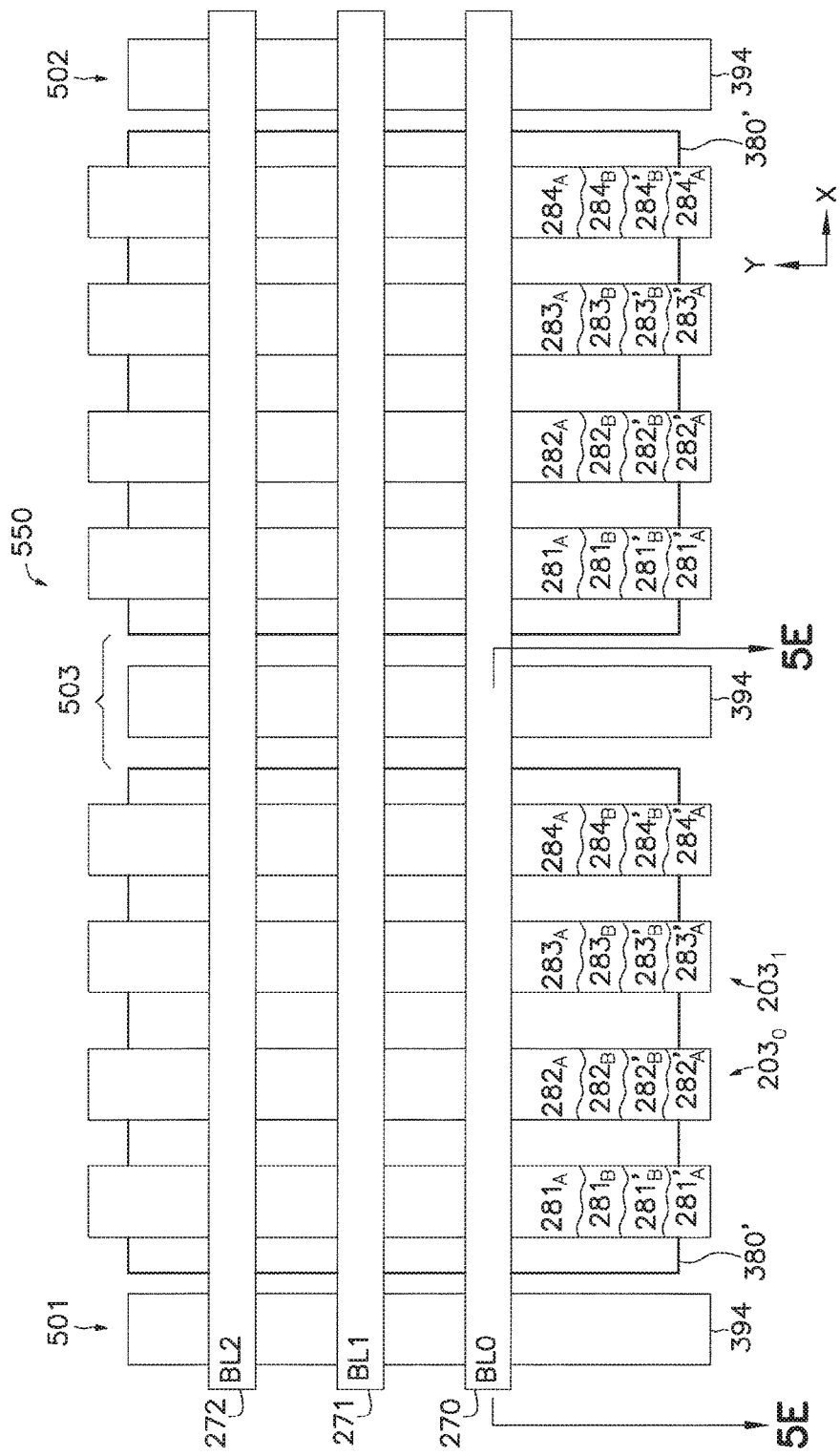

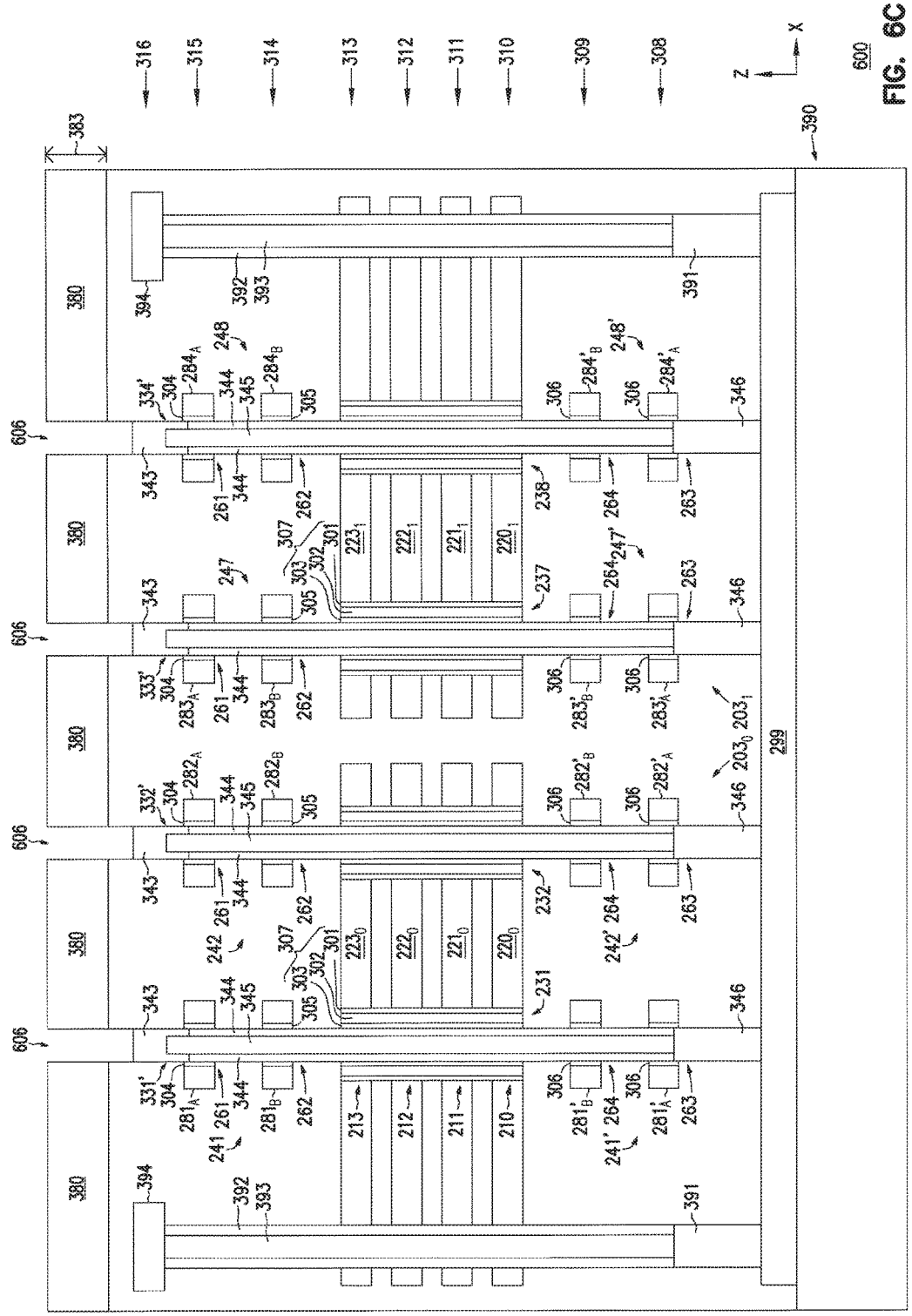

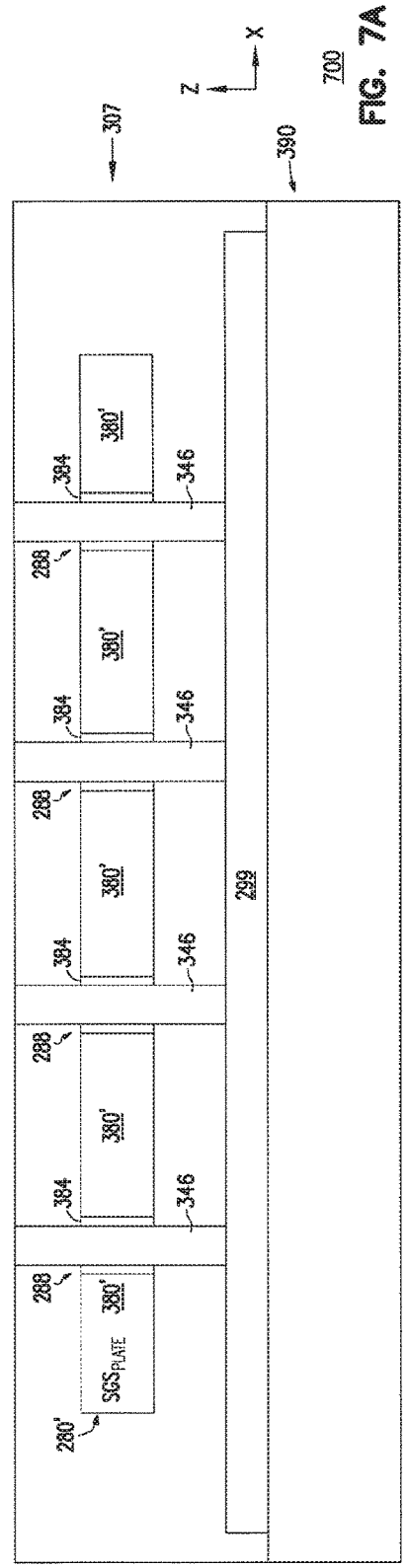

US 10,090,024 B2

MEMORY DEVICE INCLUDING CURRENT GENERATOR PLATE

PRIORITY APPLICATION

This application is a divisional of U.S. application Ser. No. 15/205,640, filed Jul. 8, 2016, which is incorporated herein by reference in its entirety.

BACKGROUND

Memory devices are widely used in computers and many electronic items to store information. A memory device usually has numerous memory cells. The memory device performs a write operation to store information in the memory cells, a read operation to retrieve the stored information, and an erase operation to clear information (e.g., obsolete information) from some or all of the memory cells. The reliability of these operations depends greatly on the structure of the memory device and the techniques used to operate it. Some conventional memory devices have structures and operations that are reliable for some applications but unsuitable for other applications.

BRIEF DESCRIPTION OF THE DRAWINGS

FIG. 2F shows a top view of the structure of the portion of the memory device of FIG. 2E, according to some embodiments described herein.

FIG. 2G shows openings in a conductive plate of the memory device of FIG. 2E, according to some embodiments described herein.

FIG. 3 shows a block diagram of a top view of a memory device including planes and a single conductive plate in each of the planes, according to some embodiments described herein.

FIG. 4A shows a block diagram of a top view of a memory device including planes and multiple conductive plates in each of the planes, according to some embodiments described herein.

FIG. 5F shows a top view of a structure of a portion of the memory device of FIG. 5E, according to some embodiments described herein.

FIG. 6A through FIG. 6E show processes of forming a memory devices including a conductive plate (e.g., SGD (select gate drain side) conductive plate) immediately next to data lines, according to some embodiments described herein.

FIG. 7A through FIG. 7C show processes of forming a memory devices including a conductive plate (e.g., SGS (select gate source side) conductive plate) immediately next to a source (e.g., source line), according to some embodiments described herein.

DETAILED DESCRIPTION

Figure 1:
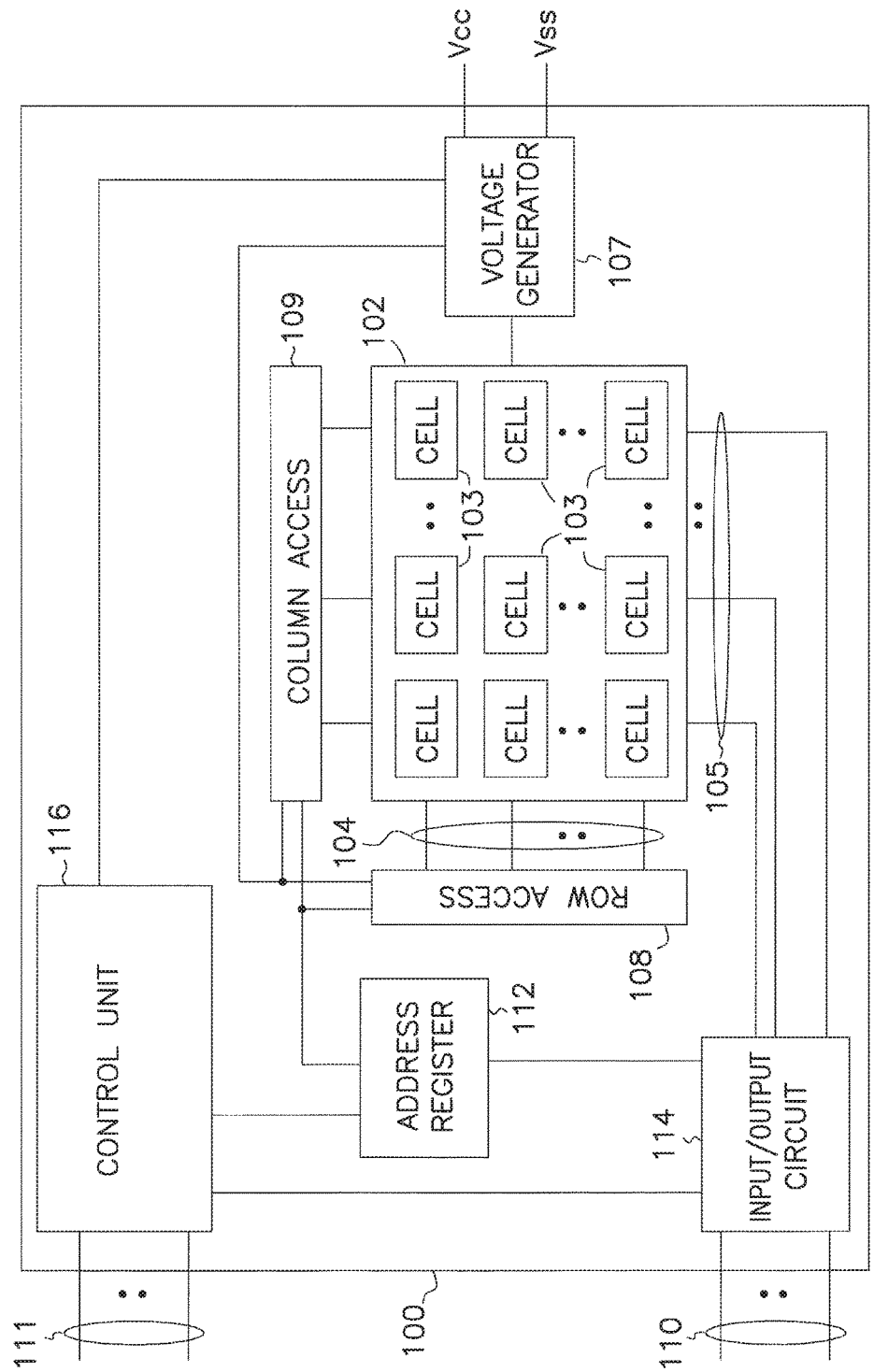
FIG. 1 shows a block diagram of an apparatus in the form of a memory device, according to some embodiments described herein.

FIG. 1 shows a block diagram of an apparatus in the form of a memory device 100, according to some embodiments described herein. Memory device 100 can include a memory array 102 having memory cells 103 that can be arranged in rows and columns along with lines (e.g., access lines) 104 and lines (e.g., data lines) 105. Memory device 100 can use lines 104 to access memory cells 103 and lines 105 to exchange information with memory cells 103.

Row access 108 and column access 109 circuitry can respond to an address register 112 to access memory cells 103 based on row address and column address signals on lines 110, 111, or both. A data input/output circuit 114 can be configured to exchange information between memory cells 103 and lines 110. Lines 110 and 111 can include nodes within memory device 100 or pins (or solder balls) on a package where memory device 100 can reside.

A control unit 116 can control operations of memory device 100 based on signals present on lines 110 and 111. A device (e.g., a processor or a memory controller) external to memory device 100 can send different commands (e.g., read, write, and erase commands) to memory device 100 using different combinations of signals on lines 110, 111, or both.

Memory device 100 can respond to commands to perform an operation on memory cells 103. An operation of an apparatus (e.g., a memory device) described herein can include a read operation, a write operation, or an erase operation of a memory device described herein (e.g., memory device 100 or other memory devices described below). In FIG. 1, memory device 100 can perform a read operation to retrieve (e.g., read) information from memory cells 103, a write (e.g., programming) operation to store (e.g., program) information into memory cells 103, and an erase operation to erase information from some or all of memory cells 103.

Memory device 100 can receive a supply voltage, including supply voltages Vcc and Vss. Supply voltage Vss can operate at a ground potential (e.g., having a value of approximately zero volts). Supply voltage Vcc can include an external voltage supplied to memory device 100 from an external power source such as a battery or an alternating current to direct current (AC-DC) converter circuitry. Memory device 100 can include a voltage generator 107 to generate different voltages for use in operations of memory device 100, such as read, write, and erase operations.

Each of memory cells 103 can be programmed to store information representing a value of a fraction of a bit, a value of a single bit, or a value of multiple bits such as two, three, four, or another number of bits. For example, each of memory cells 103 can be programmed to store information representing a binary value "0" or "1" of a single bit. The single bit per cell is sometimes called a single level cell. In another example, each of memory cells 103 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 100 can include a non-volatile memory device, and memory cells 103 can include non-volatile memory cells, such that memory cells 103 can retain information stored thereon when power (e.g., Vcc, Vss, or both) is disconnected from memory device 100. For example, memory device 100 can be a flash memory device, such as a NAND flash or a NOR flash memory device, or another kind of memory device, such as a variable resistance memory device (e.g., a phase change or resistive RAM (Random Access Memory) device).

Memory device 100 can include a memory device where memory cells 103 can be physically located in multiple levels on the same device, such that some of memory cells 103 can be stacked over some other memory cells 103 in multiple levels over a substrate (e.g., a semiconductor substrate) of memory device 100. One of ordinary skill in the art may recognize that memory device 100 may include other elements, several of which are not shown in FIG. 1, so as not to obscure the example embodiments described herein. At least a portion of memory device 100 can include structures similar to or identical to the memory devices described below with reference to FIG. 2A through FIG. 8.

Figure 2A:
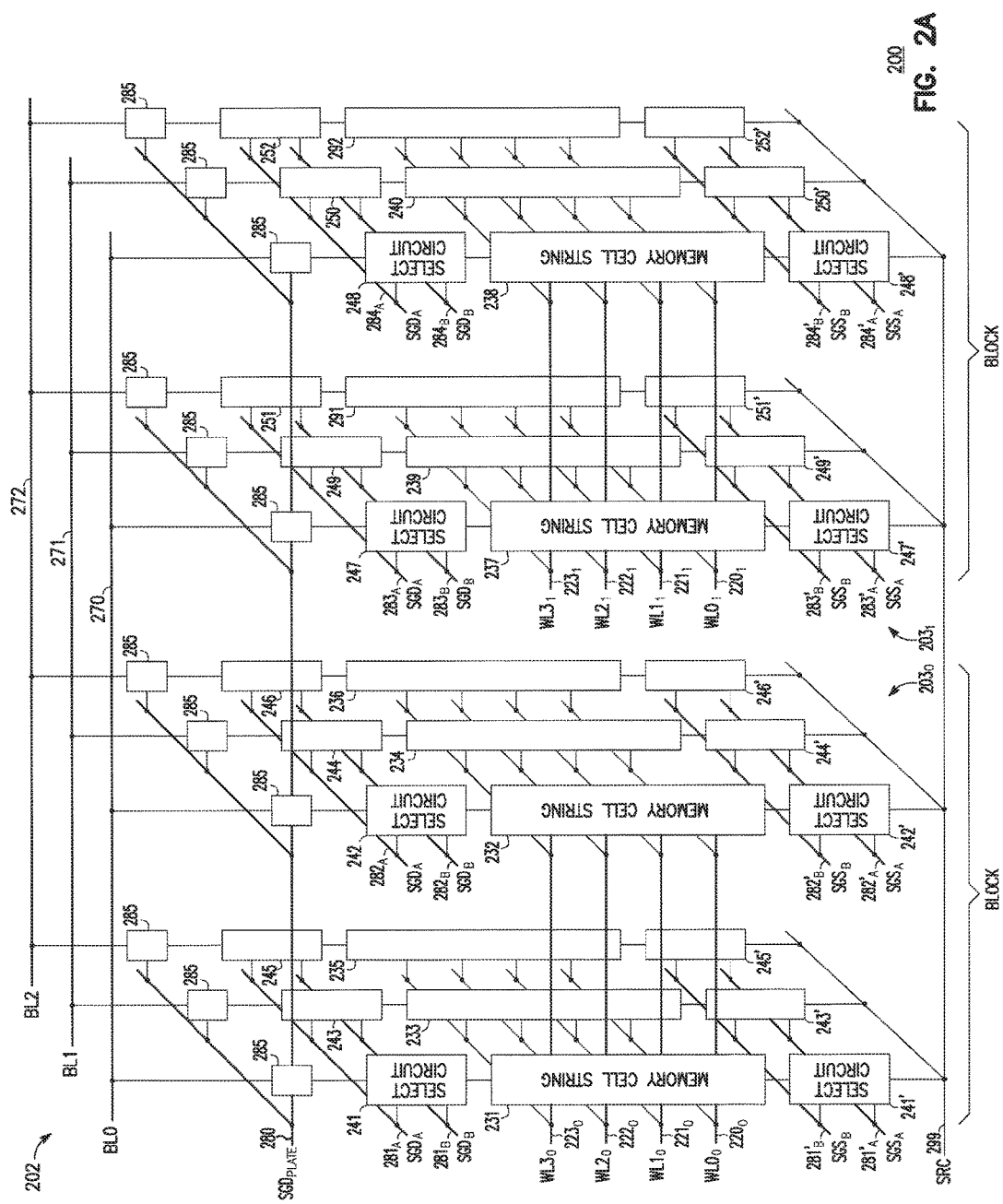
FIG. 2A shows a block diagram of a portion of a memory device including a memory array having circuits (e.g., gate-induced drain leakage (GIDL) generator circuits), memory cell strings, and select circuits (e.g., drain and source select circuits), according to some embodiments described herein.

FIG. 2A shows a block diagram of a portion of a memory device 200 including a memory array 202 having circuits 285, memory cell strings 231 through 240, 291, and 292, select circuits 241 through 252 and 241' through 252', according to some embodiments described herein. Memory device 200 can correspond to memory device 100 of FIG. 1. For example, memory array 202 can form part of memory array 102 of FIG. 1.

As shown in FIG. 2A, memory device 200 can include blocks (blocks of memory cells) blocks $203_0$ and $203_1$. Two blocks are shown as an example. Memory device 200 can include many blocks (e.g., up to thousands or more blocks). Each of blocks $203_0$ and $203_1$ has its own memory cell strings and associated select circuits. For example, block $203_0$ has memory cell strings 231 through 236, and select circuits 241 through 246 and 241' through 246'. Block $203_1$ has memory cell strings 237 through 240, 291, and 292, and select circuits 247 through 252 and 247' through 252'. Each of memory cell strings 231 through 240, 291, and 292 has memory cells (shown in FIG. 2B) arranged in a string (e.g., coupled in series among each other) to store information. During an operation (e.g., write or read) of memory device 200, memory cell strings 231 through 240, 291, and 292 can be individually selected to access the memory cells in the selected memory cell string in order to store information in or retrieve information from the selected memory cell string. During an erase operation, all of memory cell strings in a particular block can be selected (e.g., concurrently selected) to erase information from them.

Each of the memory cell strings 231 through 240, 291, and 292, can be associated with (e.g., coupled to) two select circuits. For example, memory cell string 231 is associated with select circuit (e.g., top select circuit) 241 and select circuit (e.g., bottom select circuit) 241'. FIG. 2A shows an example of six memory cell strings and their associated circuits (e.g., top and bottom select circuits) in each of blocks $203_0$ and $203_1$. The number of memory cell strings and their associated select circuits in each of blocks $203_0$ and $203_1$ can vary.

Memory device 200 can include lines 270, 271, and 272 that carry signals BL0, BL1, and BL2, respectively. Each of lines 270, 271, and 272 can be structured as a conductive line and can form part of a respective data line (e.g., bit line) of memory device 200. The memory cell strings of blocks $203_0$ and $203_1$ can share lines 270, 271, and 272. For example, memory cell strings 231, 232, 237, and 238 can share line 270. Memory cell strings 233, 234, 239, and 240 can share line 271. Memory cell strings 235, 236, 291, and 292 can share line 272. FIG. 2A shows three lines (e.g., data lines) 270, 271, and 272 as an example. The number of data lines can vary.

Memory device 200 can include a line 299 that can carry a signal SRC (e.g., source line signal). Line 299 can be structured as a conductive line and can form part of a source (e.g., a source line) of memory device 200. Blocks $203_0$ and $203_1$ can share line 299.

Memory device 200 can include separate control lines in blocks $203_0$ and $203_1$. As shown in FIG. 2A, memory device 200 can include control lines $220_0$, $221_0$, $222_0$, and $223_0$ that can carry corresponding signals (e.g., word line signals) $WL0_0$, $WL1_0$, $WL2_0$, and $WL3_0$. Memory device 200 can include control lines $220_1$, $221_1$, $222_1$, and $223_1$ that can carry corresponding signals (e.g., word line signals) $WL0_1$, $WL1_1$, $WL2_1$, and $WL3_1$. FIG. 2A shows four control lines ($220_0$ through $223_0$ or $220_1$ through $223_1$) in each of blocks $203_0$ and $203_1$ as an example. The number of control lines can vary.

Control lines $220_0$ through $223_0$ and $220_1$ through $223_1$ can form part of respective access lines (e.g., word lines) of memory device 200 to access memory cells in a respective block. For example, during a read or write operation to store information in or retrieve information from a memory cell (or memory cells) in block $203_0$, control lines $220_0$, $221_0$, $222_0$, and $223_0$ can be activated (e.g., provided with positive voltages) to access a selected memory cell (or memory cells) in block $203_0$. In memory device 200, blocks sharing the same data lines (e.g., lines 270, 271, and 272) can be accessed (e.g., accessed during a read or write operation) one block at a time. Thus, in the example here, control lines $220_1$, $221_1$, $222_1$, and $223_1$ of block $203_1$ can be deactivated (e.g., provided with zero volts (e.g., ground)) when control lines $220_0$, $221_0$, $222_0$, and $223_0$ of $203_0$ are activated.

As shown in FIG. 2A, memory device 200 can include double (e.g., upper and lower) drain select lines, including select lines $281_A$, $282_A$, $283_A$, and $284_A$ (e.g., upper drain select lines) and select lines $281_B$, $282_B$, $283_B$, and $284_B$, (e.g., lower drain select lines). Each of select lines $281_A$, $282_A$, $283_A$, and $284_A$ can carry a separate (e.g., different) signal (e.g., an upper select line signal) $SGD_A$. Each of select lines $281_B$, $282_B$, $283_B$, and $284_B$ can carry a separate signal (e.g., a lower select line signal) $SGD_B$.

As shown in FIG. 2A, select circuits 241, 243, and 245 can share select line $281_A$ and $281_B$. Select circuits 242, 244, and 246 can share select line $282_A$ and $282_B$. Select circuits 247, 249, and 251 can share select line $283_A$ and $283_B$. Select circuits 248, 250, and 252 can share select line $284_A$ and $284_B$. Each of select circuits 241 through 252 can include multiple select gates (e.g., multiple transistors, shown in FIG. 2B) that can be controlled (e.g., turned on or turned off) by two respective select lines (e.g., $281_A$ and $281_B$, $282_A$ and $282_B$, $282_A$ and $283_B$, or $284_A$ and $284_B$).

Memory device 200 can include double (e.g., lower and upper) source select lines, including select lines $281'_A$, $282'_A$, $283'_A$, and $284'_A$ (e.g., lower source select lines) and select lines $281'_B$, $282'_B$, $283'_B$, and $284'_B$ (e.g., upper source select lines). Each of select lines $281'_A$, $282'_A$, $283'_A$, and $284'_A$ can carry a separate (e.g., different) signal $SGS_A$. Alternatively, lines $281'_A$, $282'_A$, $283'_A$, and $284'_A$ can carry the same signal. Each of select lines $281'_B$, $282'_B$, $283'_B$, and $284'_B$ can carry a separate (e.g., different) signal $SGS_B$. Alternatively, lines $281'_B$, $282'_B$, $283'_B$, and $284'_B$ can carry the same signal.

Each of select circuits 241' through 252' can share two select lines. For example, select circuits 241', 243', and 245' can share select lines $281'_A$ and $281'_B$. Select circuits 242', 244', and 246' can share select lines $282'_A$ and $282'_B$. Select circuits 247', 249', and 251' can share select lines $283'_A$ and $283'_B$. Select circuits 248', 250', and 252' can share select lines $284'_A$ and $284'_B$. Each of select circuits 241' through 252' can include multiple select gates (e.g., multiple transistors, shown in FIG. 2B) that can be controlled (e.g., turned on or turned off) two respective select lines (e.g., $281'_A$ and $281'_B$, $282'_A$ and $282'_B$, $283'_A$ and $283'_B$, or $284'_A$ and $284'_B$).

Each of circuits 285 can be coupled in series with a respective select circuit (among select circuits 241 through 252) between a respective data line (one of lines 270, 271, and 272) and a respective memory string (among memory cell strings 231 through 240, 291, and 292). Each of circuits 285 can include a transistor (shown in FIG. 2B).

As shown in FIG. 2A, memory device 200 can include a line 280 that can carry a signal $SGD_{PLATE}$. Line 280 can include a conductive plate (e.g., a layer of conductive material) in the structure of memory device 200. Circuits 285 can share line 280, such that the same signal (e.g., signal $SGD_{PLATE}$) provided to line 280 can be used to control (activate or deactivate) all of circuits 285. For example, during an operation (e.g., read or write operation) of memory device 200, signal $SGD_{PLATE}$ can be used to concurrently activate (e.g., concurrently turn on) transistors of circuits 285.

Activating circuits 285 can include providing (e.g., applying) a voltage to signal $SGD_{PLATE}$. The voltage provided to signal $SGD_{PLATE}$ can have different values for different operations of memory device 200. For example, the value of the voltage provided to signal $SGD_{PLATE}$ during an erase operation can be much higher than the value of the voltage provided to signal $SGD_{PLATE}$ during a read or write operation. As an example, signal $SGD_{PLATE}$ can be provided with a voltage of 15V (volt) to 17V during an erase operation of memory device and a voltage of approximately 3V to 5V during a read or write operation of memory device 200.

During an operation of memory device 200, one or both select circuits associated with a selected memory cell string can be activated (e.g., by turning on the transistors in the select circuits), depending on which operation memory device 200 performs on the selected memory cell string. During an operation of memory device 200, memory device 200 can select a memory cell of a particular memory cell string as a selected memory cell in order to store information in (e.g., during a write operation) or to retrieve information from (e.g., during a read operation) the selected memory cell. During an erase operation, memory device 200 can select a block as a selected block to erase information from memory cells in a portion (e.g., a sub-block) of the selected block or memory cells from the entire selected block.

Activating a particular select circuit among select circuits 247 through 252 during an operation of memory device 200 can include providing (e.g., applying) voltages having certain values to signals $SGD_A$ and $SGD_B$ associated with that particular select circuit. Activating a particular select circuit among select circuits 247' through 252' can include providing (e.g., applying) voltages having certain values to signals $SGS_A$ and $SGS_B$ associated with that particular select circuit. When a particular select circuit among select circuits 241 through 252 is activated during a particular operation, it can couple (e.g., form a current path from) a selected memory cell string associated with that particular select circuit to a respective data line (e.g., one of lines 270, 271, or 272) through a respective circuit 285 (which is also activated during that particular operation). When a particular select circuit among select circuits 241' through 252' is activated, it can couple (e.g., form a current path from) a selected memory cell string associated with that particular select circuit to a source (e.g., line 299).

Figure 2B:
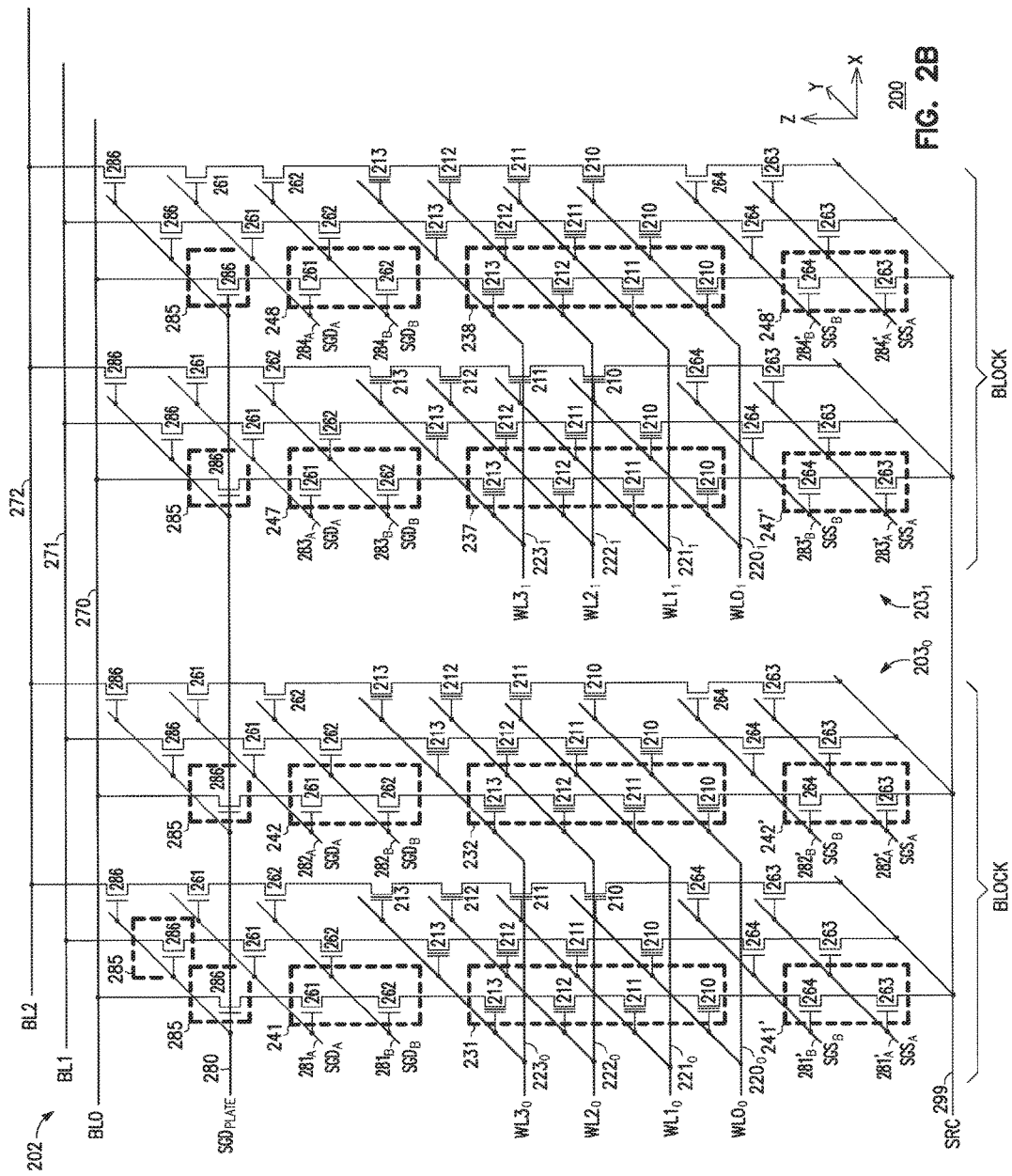
FIG. 2B shows a schematic diagram of the memory device of FIG. 2A, according to some embodiments described herein.

FIG. 2B shows a schematic diagram of memory device 200 of FIG. 2A, according to some embodiments described herein. For simplicity, only four memory cell strings 231, 232, 237 and 238 and eight select circuits 241, 242, 243, 245, 247, 248, 241', 242', 247', and 248' of FIG. 2A are labeled in FIG. 2B. As shown in FIG. 2B, memory device 200 can include memory cells 210, 211, 212, and 213, select gates (e.g., drain select gates) 261 and 262 and select gates (e.g., source select gates) 263 and 264 that can be physically arranged in three dimensions (3-D), such as x, y, and z dimensions, with respect to of the structure (shown in FIG. 2F and FIG. 2G) of memory device 200.

As shown in FIG. 2B, each of the memory cell strings (e.g., strings 231, 232, 237 and 238) of memory device 200 can include one of memory cells 210, one of memory cells 211, one of memory cells 212, and one of memory cells 213. FIG. 2B shows an example where memory device 200 has of four levels (e.g., four tiers) of respective memory cells 210, 211, 212, and 213 and four memory cells in each of the memory cell strings. The number of levels (e.g., tiers) of memory cells of memory device 200 can vary. Thus, the number of memory cells in each memory cell string can also vary. Further, one skilled in the art would recognize that some of the memory cells among memory cells 210, 211, 212, and 213 of memory cell strings 231 through 240, 291, and 292, may be dummy memory cells. Dummy memory cells are memory cells that are not configured to store information. Dummy memory cells may be configured for purposes known to those skilled in the art. In some examples of memory device 200, one or two (or more) of memory cells at the two ends of each memory cell strings 231 through 240, 291, and 292 (e.g., memory cells immediately next to select gates 262, select gates 264, or both select gates 262 and 264) may be dummy memory cells.

As shown in FIG. 2B, circuits 285 can include transistors 286, such that each of circuits 285 includes a respective transistor among transistors 286. For simplicity, only five of circuits 285 are labeled in FIG. 2B. Each of transistors 286 can be a field-effect transistor (FET). An example of an FET includes a metal-oxide semiconductor (MOS) transistor. Line 280 can be coupled to the gate of each of transistors 286. Thus, the same signal $SGD_{PLATE}$ can be used to control (e.g., turn on or turn off) transistors 286. For example, during a read or write operation of memory device, signal $SGD_{PLATE}$ can be provided with voltages, such that transistors 286 are turned on. During an erase operation, signal $SGD_{PLATE}$ can be provided with a voltage to cause transistors 286 to be in a condition, such that GIDL current can be generated.

Each of select circuits 241, 242, 247, and 248 can include double select gates (e.g., double drain select gates): one of select gates 261 and one of select gates 262. Each of select circuits 241', 242', 247', and 248' can include double select gates (e.g., double source select gates): one of select gates 263 and one of select gates 264. Each of select gates 261, 262, 263, and 264 can operate as a transistor, such as a FET. FIG. 2B shows each of select gates 261, 262, 263, and 264 having FET structure as an example. In some examples of memory device 200, some or all of select gates 261, 262, 263, and 264 can have structures similar to the structures of memory cells 210, 211, 212, and 213.

In memory device 200, a select line (e.g., select line $281_A$, $282_A$, $283_A$, $284_A$, $281_B$, $282_B$, $283_B$, $284_B$, $281'_A$, $282'_A$, $283'_A$, $284'_A$, $281'_B$, $282'_B$, $283'_B$, or $284'_B$) can carry a signal (e.g., signal $SGD_A$, $SGD_B$, $SGS_A$, or $SGS_B$) but it does not operate like a switch (e.g., a transistor). A select gate (e.g., select gate 261, 262, 263, or 264) can receive a signal from a respective select line and can operate like a switch (e.g., a transistor, such as a FET).

In order to focus on the embodiments discussed herein, the description below with reference to FIG. 2C through FIG. 2G focuses on four memory cell strings 231, 232, 237, and 238, select circuits 241, 242, 247, 248, 241', 242', 247', and 248', and circuits 285. Other memory cell strings and select circuits of memory device 200 have similar structures and connections.

Figure 2C:
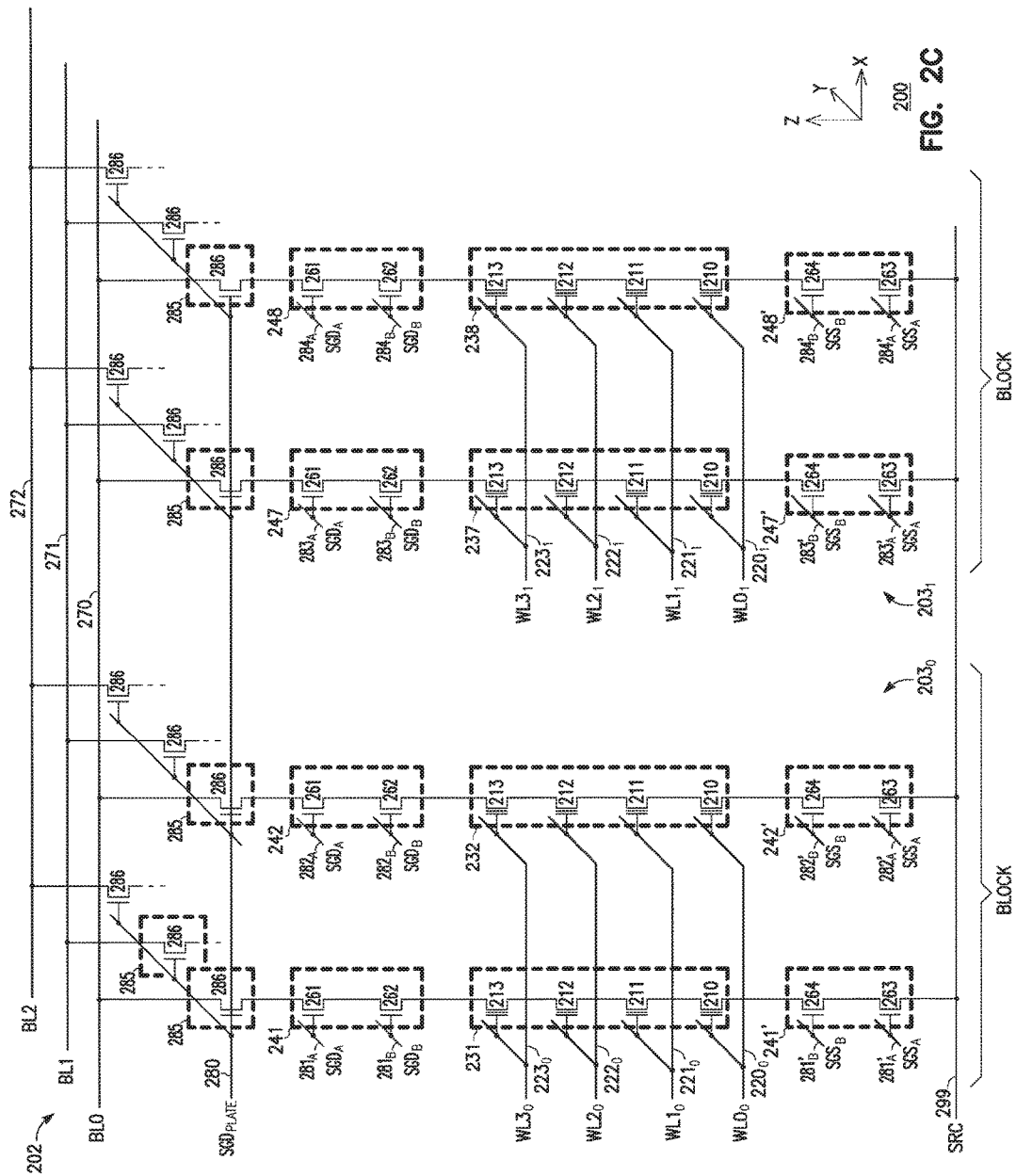
FIG. 2C shows a schematic diagram of a portion of the memory device of FIG. 2B, according to some embodiments described herein.

FIG. 2C shows a schematic diagram of a portion of memory device 200 of FIG. 2B including lines 270, 271, 272, circuits 285, select circuits 241, 242, 247, 248, memory cell strings 231, 232, 237, and 238, select circuits 241', 242', 247', and 248', and line 299, according to some embodiments described herein. As shown in FIG. 2C, select gates 261 and 262 of each of select circuits 241, 242, 247, and 248 can be coupled in series with one of transistors 286 between line 270 and a respective memory cell string among memory cell strings 231, 232, 237, and 238. Select gates 263 and 264 of each of select circuits 241', 242', 247', and 248' can be coupled in series between line 299 and a respective memory cell string among memory cell strings 231, 232, 237, and 238.

Select gate 261 of select circuit 241 has a terminal (e.g., a transistor gate) that can be part of (e.g., formed by a portion of) select line $281_A$. Select gate 262 of select circuit 241 has a terminal (e.g., a transistor gate) that can be part of (e.g., formed by a portion of) select line $281_B$. Select gates 261 and 262 of select circuit 241 can be controlled (e.g., turned on or turned off) by signals $SGD_A$ and $SGD_B$ provided to select lines $281_A$ and $281_B$, respectively.

Select gate 263 of select circuit 241' has a terminal (e.g., a transistor gate) that can be part of (e.g., formed by a portion of) select line $281'_A$. Select gate 264 of select circuit 241' has a terminal (e.g., a transistor gate) that can be part of (e.g., formed by a portion of) select line $281'_B$. Select gates 263 and 264 of select circuit 241' can be controlled (e.g., turned on or turned off) by signals $SGS_A$ and $SGS_B$ provided to select lines $281'_A$ and $281'_B$, respectively.

Similarly, as shown in FIG. 2C, select gates 261 and 262 of each of select circuits 242, 247, and 248 also have terminals (transistor gates) that can be parts of (e.g., formed by portions of) respective select lines among select lines $282_A$, $283_A$, $284_A$, $282_B$, $283_B$, and $284_B$. Select gate 263 of each of select circuits 242', 247', and 248' also has a terminal (transistor gate) that can be part of (e.g., formed by a portion of) a respective select line among select lines 282', 283', and 284'.

During an operation (e.g., a read or write operation) of memory device 200, select gates 261, 262, 263, and 264 of particular select circuits associated with a selected memory cell string can be activated (e.g., turned on) to couple the selected memory cell string to a respective data line (e.g., line 270, 271, or 272) and the source (e.g., line 299). For example, in FIG. 2C, during a write operation of memory device 200, if memory cell string 231 is a selected memory cell string, then select gates 261 and 262 of select circuit 241 can be activated to couple memory cell string 231 to line 270; select gate 264 of select circuit 241' may not be activated. In another example, in FIG. 2C, during a read operation of memory device 200, if memory cell string 231 is a selected memory cell string, then select gates 261 and 262 of select circuit 241 can be activated to couple memory cell string 231 to line 270; select gates 263 and 264 of select circuit 241' can also be activated to couple memory cell string 231 to line 299. In these two examples here, while memory cell string 231 is selected, memory cell strings 232, 237, and 238 can be deselected. Thus, select gates 261, 262, 263, and 264 in select circuits 242, 247, 248, 242', 247', and 248' (associated with memory cell strings 232, 237, and 238) can be deactivated (e.g., turned off) to decouple memory cell strings 232, 237, and 238 from line 270 and line 299.

In an erase operation of memory device 200, the select lines associated with drain and source select gates of a selected block (a block selected to erase information from it) can be placed in a float state. For example, if block $203_0$ is a selected block during an erase operation, then select lines $281_A$, $281_B$, $282_A$ and $282_B$ (and associated select gates 261 and 262) and select lines $281'_A$, $281'^B$, $282'_A$ and $282'_B$ (and associated select gates 263 and 264) can be placed in a float state. In an erase operation of memory device 200, drain and source select lines (and their associated select gates) of a deselected block (a block not selected to erase information from it) can be deactivated. For example, if block $203_0$ is a deselected block during an erase operation, then select lines $283_A$, $283_B$, $284_A$ and $284_B$ (and associated select gates 261 and 262) and select lines $283'_A$, $283'_B$, $284'_A$ and $284'_B$ (and associated select gates 263 and 264) can be deactivated.

As mentioned above, voltages can be provided to signal $SGD_{PLATE}$ during read, write, and erase operations of memory device 200. However, the values of the voltages provided to signal $SGD_{PLATE}$ can be different among read, write, and erase operations.

Figure 2D:
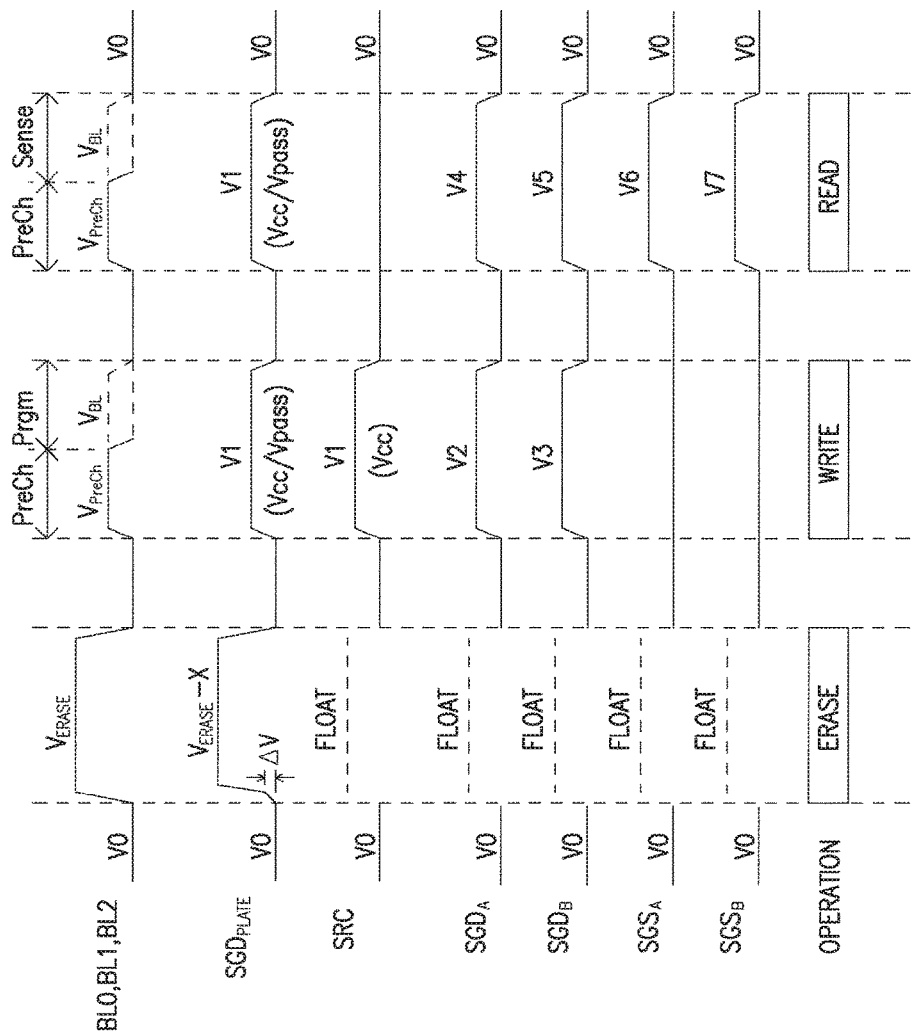
FIG. 2D shows example waveforms of some of the signals of the memory device of FIG. 2A through FIG. 2C during example erase, write, and read operations, according to some embodiments described herein.

FIG. 2D shows example waveforms of signals BL0, BL1, BL2, $SGD_{PLATE}$, SRC, $SGD_A$, $SGD_B$, $SGS_A$, and $SGS_B$ of memory device 200 (FIG. 2A through FIG. 2C) during example erase, write, and read operations, according to some embodiments described herein. Signals $SGD_A$, $SGD_B$, $SGS_A$, and $SGS_B$ shown in FIG. 2D are associated with a block (e.g., either block $203_0$ or block $203_1$) of memory device 200 that is selected during the example erase, write, and read operations. FIG. 2D omits other signals (e.g., some of signals shown in FIG. 2C) of memory device 200 to help focus on the embodiments of the memory device described herein. During erase, write, and read operations of memory device 200, the omitted signals can be provided with voltages having values known to those skilled in the art.

In FIG. 2D, each of voltages $V_{ERASE}$ and $V_{ERASE}$-X can have value greater than the value of each of voltages V1 through V7, $V_{PreCh}$, $V_{BL}$, and V0. Voltage V0 can be 0V (e.g., ground potential, such as Vss). Each of voltages V1 through V7 can have a positive value (e.g., a value greater than the value of voltage V0). Voltage $V_{ERASE}$ can have a value of approximately 20V. The value of X can be approximately 3V to 5V (e.g., $V_{ERASE}$-X can be approximately 20V-X=15V to 17V). Voltage V1 can be either voltage Vcc (e.g., a supply voltage of memory device 200) or voltage Vpass. Voltage Vcc can have a value of approximately between 1V and 3V (or other values). Voltage Vpass can have a value that can cause unselected memory cells of a selected memory cell string to operate as an active conductive path (e.g., to conduct current) during a read or write operation. Voltage Vpass can have a value of approximately 3V to 5V (or other values). Voltage $V_{PreCh}$ can have a value between 0.5V up to the value of voltage Vcc. Each of voltages V2 through V7 can have a value equal to the value of voltage Vcc or other values to turn on respective drain select gates (e.g., 261 and 262 in FIG. 2C) and source select gates (e.g., 263 and 264 in FIG. 2C) during write and read operations.

During the write operation, voltage $V_{BL}$ can have a value that depends on the value (e.g., value of a bit) of information to be stored in a selected memory cell. During the read operation, voltage $V_{BL}$ can have a value that depends on the value (e.g., value of a bit) of information sensed from a selected memory cell. The specific values of the voltages associated with erase, write, and read operations shown in FIG. 2D and in this description here are example values. Other voltage values may be used. The following description refers to FIG. 2C and FIG. 2D.

As shown in FIG. 2D, during the erase operation, signals BL0, BL1, and BL2 can be provided with a voltage $V_{ERASE}$ to erase information stored in memory cells 210, 211, 212, and 213 of the memory strings of a selected block (e.g., block $203_0$ or block $203_1$ in FIG. 2C). Line 299 (FIG. 2C) used to provide signal SRC can be placed in a float state. In the float state, line 299 can be decoupled from a bias voltage (decoupled from direct current (DC) voltage source). This decoupling allows the value of the voltage on line 299 to be proportional to the value of voltage $V_{ERASE}$. For example, if voltage $V_{ERASE}$ has a value of 20V, then the voltage on line 299 can have value up to 20V.

During the erase operation, transistors 286 (FIG. 2C) can operate to generate GIDL (e.g., operate as GLDL current generators) to help the erase operation. For example, the GIDL current generated by transistors 286 during the erase operation may speed up the charging of the body of the memory cell strings in the selected block. Since transistors 286 can operate as GIDL current generators during the erase operation, select gates 261 and 262 may be not be used for generating GIDL current during the erase operation. Thus, the drain select lines (e.g., lines $281'_A$, $281'_B$, $282'_A$ and $282'_B$ (FIG. 2C) used to provide signals $SGD_A$ and $SGD_B$ to control select gates 261 and 262 of the selected block can be placed in a float state. In the float state, the drain select lines of the selected block can be decoupled from a bias voltage (decoupled from a DC voltage source). This decoupling allows the values of voltages (provide by signals $SGD_A$ and $SGD_B$) on the drain select lines of the selected block to be proportional to the value of voltage $V_{ERASE}$. For example, if voltage $V_{ERASE}$ has a value of 20V, then the voltage on the drain select lines of the selected block can have a value up to 20V.

During the erase operation, the source select lines (e.g., lines $281'_A$, $281'_B$, $282'_A$ and $282'_B$ (FIG. 2C) used to provide signals $SGS_A$ and $SGS_B$ to control select gates 263 and 264 of the selected block can be placed in a float state. In the float state, the source select lines of the selected block can be decoupled from a bias voltage (decoupled from a DC voltage source). This decoupling allows the values of voltages on the source select lines of the selected block to be proportional to the value of voltage $V_{ERASE}$. For example, if voltage $V_{ERASE}$ has a value of 20V, then the voltage on the source select lines of the selected block can have a value nearly up to 20V.

As shown in FIG. 2D, the write operation of memory device 200 can have different stages, such as a write precharge stage (shown as "PreCh" during the write operation in FIG. 2D) and a program stage (shown as "Prgm" in FIG. 2D) after the write precharge stage. During the write precharge stage, signal BL0, BL1, and BL2 can be provided with precharge voltage $V_{PreCh}$. During the program stage, signal BL0, BL1, and BL2 can have voltage $V_{BL}$, V0, or a voltage having a value between the values of voltages V0 and $V_{BL}$, depending on the value of information to be stored in a selected memory cell of a memory cell string coupled to a respective line among lines 270, 271, and 272 (associated with signals BL0, BL1, and BL2). During the write operation, signal $SGD_{PLATE}$ can be provided with voltage V1, such that transistors 286 (FIG. 2C) can be activated (e.g., turned on); and signal SRC can be provided with voltage V1 (e.g., Vcc) to prevent a "punch-through" event that may occur at select gates 263 and 264 of inhibit memory cell strings. During the write operation, signals $SGD_A$ and $SGD_B$ can be provided with voltages V2 and V3, respectively, and signals $SGS_A$ and $SGS_B$ can be provided with voltage V0.

The read operation of memory device 200, as shown in FIG. 2D, can have different stages, such as a read precharge stage (shown as "PreCh" during a read operation in FIG. 2D) and a sense stage (shown as "Sense" in FIG. 2D) after the read precharge stage. During the read precharge stage, signal BL0, BL1, and BL2 can be provided with precharge voltage $V_{PreCh}$. During the sense stage, signal BL0, BL1, and BL2 can have voltage $V_{BL}$ or V0, depending on the value of information sensed from a selected memory cell of a memory cell string coupled to a respective line among lines 270, 271, and 272 (associated with signals BL0, BL1, and BL2). During the read operation, signal $SGD_{PLATE}$ can be provided with voltage V1, such that transistors 286 (FIG. 2C) can be activated (e.g., turned on); and signal SRC can be provided with voltage V0. During the read operation, signals $SGD_A$ and $SGD_B$ can be provided with voltages V4 and V5, respectively; and signals $SGS_A$ and $SGS_B$ can be provided with voltages V6 and V7, respectively.

Figure 2E:
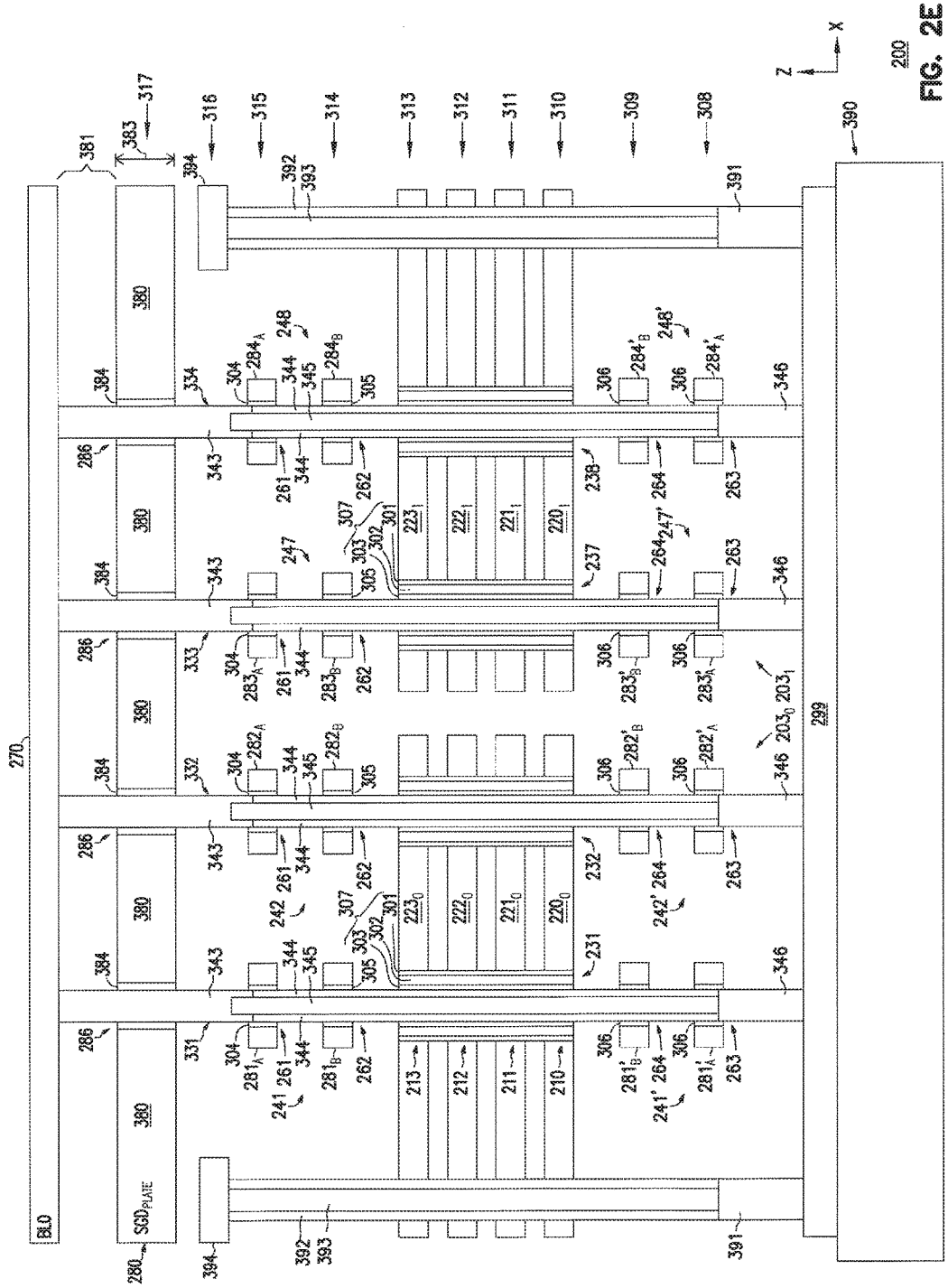
FIG. 2E shows a side view of a structure of a portion of the memory device of FIG. 2A through FIG. 2C, according to some embodiments described herein.

As shown in FIG. 2D, signal $SGD_{PLATE}$ can be provided with voltage $V_{ERASE}$-X during the erase operation. This allows transistors 286 to generate enough GIDL current to help the erase operation in memory device 200. Signal $SGD_{PLATE}$ may exhibit voltage difference ΔV (delta V with respect to voltage V0) at the beginning of the erase operation, as shown in FIG. 2D. The value of voltage difference ΔV may be relatively small (e.g., less than 5V) because line 280 can include a relative large conductive plate (e.g., large area and thickness, as shown in FIG. 2E). The relatively large conductive plate may cause the capacitive coupling from lines 270, 271, and 272 to line 280 (e.g., the capacitive coupling ratio between line 280 and lines 270, 271, and 272) to be relatively small. Thus, in FIG. 2D, the value of voltage difference ΔV may be relatively small (e.g., less than 5V). The small value of voltage difference ΔV may have negligible or no influence on the GIDL current generation during the erase operation.

Further, as mentioned above, transistors 286 can operate as GIDL current generators during an erase operation, and select gates 261 and 262 may not be used for generating GIDL current during the erase operation. Not using select gates 261 and 262 for generating GIDL current during an erase operation in memory device 200 may prevent select gates 261 and 262 from potential degradation. This may help maintain the reliability of memory device 200.

FIG. 2E shows a side view of a structure of a portion of memory device 200, according to some embodiments described herein. The structure of memory device 200 in FIG. 2E corresponds to part of the schematic diagram of memory device 200 shown in FIG. 2C. As shown in FIG. 2E, memory device 200 can include a substrate 390 over which memory cells 210, 211, 212, and 213 of memory cell strings 231 and 232 (of block $203_0$) and memory cell strings 237 and 238 (of block $203_1$) can be formed (e.g., formed vertically with respect to substrate 390). Memory device 200 includes different levels 308 through 317 with respect to a z-dimension. Levels 308 through 317 are internal device levels between substrate 390 and line 270 within memory device 200. As shown in FIG. 2E, memory cells 210, 211, 212, and 213 can be located in levels 310, 311, 312, and 313, respectively (e.g., arranged vertically in the z-dimension with respect to substrate 390). Select gates 261, 262, 263, and 264 of select circuits 241, 241', 242, and 242' (of block $203_0$) and select circuits 247, 247', 248, and 248' (of block $203_1$) can also be formed (e.g., formed vertically) in different levels over substrate 390 as shown in FIG. 2E.

Memory device 200 can include pillars (conductive pillars) 331, 332, 333, and 334 having lengths extending outwardly (e.g., vertically) from substrate 390 in a z-dimension of memory device 200. The select lines (e.g., drain select lines and source select lines) associated with memory cell strings 231, 232, 237, and 238 can be located along a respective pillar in the z-dimension as shown in FIG. 2E. For example, select lines $281_A$, $281_B$, $281'_A$, and $281'_B$ associated with memory cell string 231 can be located in along pillar 331 in a z-dimension.

Line 280 can include a conductive plate (e.g., SGD conductive plate) 380, which can be located immediately next to line 270 and between line 270 and other components of memory device 200 (e.g., the components including the drain select lines, memory cell strings 231, 232, 237, and 328, and the source select lines). Portion 381 between line 270 and conductive plate 380 can be formed from dielectric material (e.g., $SiO_2$) at a selected thickness. The thickness (in the z-dimension) of portion 381 can be selected, such that the capacitive coupling between conductive plate 380 and line 270 can be selected at a value (e.g., predetermined value) in order to help precharge line 270 (and other lines 271 and 272) to a selected (e.g., desired) precharge voltage (e.g., $V_{PreCh}$ in FIG. 2D) during a read or write operation of memory device 200.

FIG. 2F shows a top view of a structure of a portion of memory device 200 of FIG. 2E, according to some embodiments described herein. The side view of the portion of memory device 200 of FIG. 2E taken along cut line 2E-2E of FIG. 2F. As shown in FIG. 2F, conductive plate 380 can be below line 270 and above other components of memory device 200 (e.g., above the drain select lines, memory cell strings 231, 232, 237, and 238, and the source select lines). Conductive plate 380 can include a single piece (e.g., a single layer) of conductive material having openings 382 at different locations.

FIG. 2G shows openings 382 in conductive plate 380. Openings 382 allows the pillars (e.g., pillars 331, 332, 333, and 334) of memory device 200 to go through in order to form connections between lines (e.g., data lines) 270, 271, and 272 and line (e.g., source) 299.

As shown in a cut-away view in FIG. 2F, select lines $281'_A$, $282'_A$, $283'_A$, and $284'_A$ have lengths extending in the y-dimension and are underneath select lines $281'_B$, $282'_B$, $283'_B$, and $284'_B$, respectively. Select lines $281'_B$, $282'_B$, $283'_B$, and $284'_B$ have lengths extending in the y-dimension and are underneath select lines $281_B$, $282_B$, $283_B$, and $284_B$, respectively. Select lines $281_B$, $282_B$, $283_B$, and $284_B$ have lengths extending in the y-dimension and are underneath select lines $281_A$, $282_A$, $283_A$, and $284_A$, respectively. Select lines $281_A$, $282_A$, $283_A$, and $284_A$ have lengths extending in the y-dimension and are underneath lines 270, 271, and 272. FIG. 2F also show pillars 331, 332, 333, and 334 (which contacts the underside of line 270) and memory cell strings 231, 232, 237, and 238 at locations relative to the locations of pillars 331, 332, 333, and 334. Portion 394 (source connection of source path) has a length extending in the y-dimension and is underneath conductive plate 380 (FIG. 2E also shows part of portion 394).

Referring to FIG. 2F, except for openings 382 where the pillars go through, conductive plate 380 can extend (e.g., continuously span) in the x-dimension from one pillar to another pillar (from among multiple pillars in the x-dimension). Conductive plate 380 can also extend (e.g., continuously spans) in the y-dimension from one pillar to another pillar (from among multiple pillars in the y-dimension).

Referring to FIG. 2E, substrate 390 of memory device 200 can include monocrystalline (also referred to as single-crystal) semiconductor material. For example, substrate 390 can include monocrystalline silicon (also referred to as single-crystal silicon). The monocrystalline semiconductor material of substrate 390 can include impurities, such that substrate 390 can have a specific conductivity type (e.g., n-type or p-type). Although not shown in FIG. 2E, substrate 390 can include circuitry that can be located directly under line 299 and pillars 331, 332, 333, and 334. Such circuitry can include buffers (e.g., page buffers), decoders, and other circuit components of memory device 200.

As shown in FIG. 2E, line (e.g., data line) 270 can have a length extending in the x-dimension, which is perpendicular to a z-dimension. Lines 270, 271, and 272 can be above conductive plate 380. Line 299 can be part of a source path that includes portions 391, 392, 393, and 394. As shown in FIG. 2E, line 299 can have a length extending in the x-dimension. FIG. 2E shows an example where line 299 (e.g., source) can be formed over a portion of substrate 390 (e.g., by depositing a conductive material over substrate 390). Alternatively, line 299 can be formed in or formed on a portion of substrate 390 (e.g., by doping a portion of substrate 390).

Each of pillars 331, 332, 333, and 334 can include a portion 343 coupled to line 270, a portion 346 coupled to line 299, a portion 344 between portions 343 and 346, and a portion 345 surrounded by portions 343, 344, and 346.

Thus, each of pillars 331, 332, 333, and 334 is a pillar of materials that includes materials of respective portions 343, 344, 345, and 346. Each of portions 343, 344, and 346 can include conductive material (e.g., doped polycrystalline silicon (doped polysilicon)). Portion 345 (e.g., a filler) can include dielectric material (e.g., an oxide of silicon, such as silicon dioxide). FIG. 2E shows an example of where each of pillars 331, 332, 333, and 334 includes portion 345 (e.g., dielectric material). Alternatively, portion 345 can be omitted, such that the material of portion 344 may also occupy the space occupied by portion 345.

Portions 343 and 346 can include materials of the same conductivity type. Portion 344 can include a material having a different conductivity type from that of portions 343 and 346. For example, portions 343 and 346 can include a semiconductor material of n-type (e.g., n-type polycrystalline silicon), and portion 344 can include a semiconductor material of p-type (e.g., p-type polycrystalline silicon). Alternatively, portions 343, 344, and 346 can include materials of the same conductivity type (e.g., n-type polycrystalline silicon).

Portion 344 and at least part of each of portions 343 and 346 can form a conductive channel (e.g., part of the body of the memory cell string) in a respective pillar among pillars 331, 332, 333, and 334. The conductive channel can carry current (e.g., current between line 270 (e.g., data line) and line 299 (e.g., source) during an operation (e.g., read, write, or erase) of memory device 200. FIG. 2E shows an example where part of portion 343 can extend from line 270 to a location in a respective pillar at approximately the level 315. However, part of portion 343 can extend from line 270 to any location in a respective pillar between level 314 and 316.

Memory cells 210, 211, 212, and 213 of memory cell string 231 can be located along a segment of pillar 331 (e.g., the segment of pillar 331 extending from level 310 to level 313). In a similar structure, memory cells 210, 211, 212, and 213 of memory cell strings 232, 237, and 238 can be located along a segment of a respective pillar among pillars 332, 333, and 334, as shown in FIG. 2E.

Control lines $220_0$, $221_0$, $222_0$, $223_0$ (of block $203_0$) and $220_1$, $221_1$, $222_1$, and $223_1$ (of block $203_1$) associated with respective memory cells 210, 211, 212, and 213 can also be located in levels 310, 311, 312, and 313, respectively, along a segment (e.g., the segment extending from level 310 to level 313) of respective pillar among pillars 332, 333, and 334, as shown in FIG. 2E. The materials of control lines $220_0$, $221_0$, $222_0$, $223_0$ (of block $203_0$) and $220_1$, $221_1$, $222_1$, and $223_1$ (of clock $203_1$) can include a conductive material (e.g., conductively doped polycrystalline silicon of n-type, metals, or other conductive materials).

As shown in FIG. 2E and FIG. 2F, a select line (e.g., select line $281_A$, $282_A$, $283_A$, $284_A$, $281_B$, $282_B$, $283_B$, and $284_B$, $281'_A$, $282'_A$, $283'_A$, $284'_A$, $281'_B$, $282'_B$, $283'_B$, and $284'_B$) is a piece (e.g., a line) of conductive material (e.g., polycrystalline silicon, metal, or other conductive materials). As described above, a select line can carry a signal (e.g., signal $SGD_A$, $SGD_B$, $SGS_A$, or $SGS_B$) but it does not operate like a switch (e.g., a transistor). A select gate (e.g., select gate 261, 262, 263, and 264) can include a portion of a select line (e.g., a portion of the piece of the conductive material that formed the select line) and additional structures to perform a function (e.g., function of a transistor). For example, in select circuit 241 in FIG. 2E, select gate 261 can include a portion of select line $281_A$ and a structure 304, and select gate 262 can include a portion of select line $281_B$ and a structure 305.

Select line $281_A$ (which includes a portion of select gate 261) can be located in level 315 along a segment of pillar 331 (e.g., the segment of pillar 331 on level 315). Select line $281_B$ (which includes a portion of select gate 262) can be located in level 314 along a segment of pillar 331 (e.g., the segment of pillar 331 on level 314). Select line $281'_A$ (which includes a portion of select gate 263) can be located in level 308 along a segment of pillar 331 (e.g., the segment of pillar 331 on level 308). Select line $281'_B$ (which includes a portion of select gate 264) can be located in level 309 along a segment of pillar 331 (e.g., the segment of pillar 331 on level 309).

In a similar structure, select lines $282_A$, $283_A$, and $284_A$ can be located in level 315 along a segment (e.g., the segment in level 315) of a respective pillar among pillars 332, 333, and 334. Select lines $282_B$, $283_B$, and $284_B$ can be located in level 314 along a segment (e.g., the segment in level 314) of a respective pillar among pillars 332, 333, and 334. Select lines $282'_A$, $283'_A$, and $284'_A$ can be located in level 308 along a segment (e.g., the segment in level 308) of a respective pillar among pillars 332, 333, and 334. Select lines $282'_B$, $283'_B$, and $284'_B$ can be located in level 309 along a segment (e.g., the segment in level 309) of a respective pillar among pillars 332, 333, and 334.

The select lines on the same level (e.g., select lines $281_A$, $282_A$, $283_A$, and $284_A$ on level 315) can have the same material. The select lines on different levels can have the same material or different materials. The materials for the select lines of memory device 200 can include conductively doped polycrystalline silicon (e.g., either n-type or p-type), metals, or other conductive materials.

As shown in FIG. 2E, each of memory cell strings 231, 232, 237, and 238 can include a structure 307, which includes portions 301, 302, and 303 between a respective pillar and control lines. For example, structure 307 in memory cell string 231 is between pillar 331 and includes control lines $220_0$, $221_0$, $222_0$, and $223_0$. Each of memory cells 210, 211, 212, and 213 of memory cell string 231 can include part of structure 307 (part of portions 301, 302, and 303). Structure 307 can be part of a TANOS (TaN, $Al_2O_3$, $Si_3N_4$, $SiO_2$, Si) structure. For example, portion 301 (e.g., interpoly dielectrics) can include a charge blocking material or materials (e.g., a dielectric material such as TaN and $Al_2O$) that is capable of blocking a tunneling of a charge. Portion 302 can include a charge storage element (e.g., charge storage material or materials, such as $Si_3N_4$) that can provide a charge storage function (e.g., trap charge) to represent a value of information stored in memory cells 210, 211, 212, or 213. Portion 303 can include a tunnel dielectric material or materials (e.g., $SiO_2$) that is capable of allowing tunneling of a charge (e.g., electrons). As an example, portion 303 can allow tunneling of electrons from portion 344 to portion 302 during a write operation and tunneling of electrons from portion 302 to portion 344 during an erase operation of memory device 200. Moreover, portion 303 can allow tunneling of holes from portion 344 to portion 302, compensating the trapped electrons recombination during an erase operation of memory device 200. In an alternative arrangement of memory device 200, structure 307 can be part of a SONOS (Si, $SiO_2$, $Si_3N_4$, $SiO_2$, Si) structure. In another alternative arrangement, structure 307 can be part of a floating gate structure.

Portion 391 can include conductive material (e.g., doped polycrystalline silicon (e.g., n-type polysilicon)). Portion 392 can include dielectric material (e.g., $SiO_2$). Portion 393 can include metal (e.g., tungsten or other metals). Portion 394 can include metal (e.g., tungsten or other metals).

Portion 393 can be surrounded by portion 392. As shown in FIG. 2E, portions 391, 392, and 393 can form a vertical column in the z-direction (e.g., perpendicular to substrate 390) that provides electrical connection (through materials 391 and 393) between line 299 and portion 394 (e.g., source connection).

In FIG. 2E, each of select gates 261 can include a structure 304 between a respective select line and a respective pillar. For example, select gate 261 of select circuit 241 includes structure 304 between select line $281_A$ and pillar 331.

Each of select gates 262 can include a structure 305 between a respective select line and a respective pillar. For example, select gate 262 of select circuit 241 includes structure 305 between select line $281_B$ and pillar 331. Each of select gates 263 can include a structure 306 between a respective select line and a respective pillar. For example, select gate 263 of select circuit 241' includes structure 306 between select line $281'_A$ and pillar 331.

Conductive plate 380 includes a conductive material. As an example, conductive plate 380 can include conductively doped polycrystalline silicon (polycrystalline silicon of n-type of p-type). Other conductive materials can be used. As shown in FIG. 2E, conductive plate 380 can include portions located in level 317 adjacent (e.g., facing) respective segments of pillars 331, 332, 333, and 334.

Each of transistors 286 can include a respective portion (e.g., a transistor gate) of conductive plate 380, a structure (e.g., dielectric) 384 between a respective portion of conductive plate 380, and a portion (e.g., transistor body channel) of a respective pillar. As described above, each of transistors 286 can be a FET. As is known to those skilled in the art, a FET usually includes a transistor gate, a body channel, and a gate oxide between the transistor gate and the transistor body channel and can be in direct contact with the transistor gate and the transistor body channel. A FET does not have a charge storage element (e.g., a charge trap, a floating gate, or other memory element) that provides a charge storage function. Thus, structure 384 may not include a charge storage element that provides a charge storage function. Therefore, unlike memory cells 210, 211, 212, and 213, each of transistors 286 may not include a charge storage element that provides a charge storage function. For example, structure 384 of each of transistors 286 can include only a dielectric material (e.g., $SiO_2$).

FIG. 2E shows select gates 261, 262, 263, and 264 being FET structures as an example. In this example, structures 304, 305, and 306 can include similar or the same material (or materials). For example, each of structures 304, 305, and 306 can include only a dielectric material (e.g., includes only an oxide of silicon without a charge storage element). In an alternative arrangement of memory device 200, each of select gates 261, 262, 263, and 264 can have the same structure as the structure (e.g., a structure including a charge storage element, such as TANOS structure) of each of memory cells 210, 211, 212, and 213. In the alternative arrangement, select gates 261, 262, 263, and 264 may be formed concurrently (e.g., formed by the same process step (or steps)) with memory cells 210, 211, 212, and 213.

In FIG. 2E, each of transistors 286 has a body channel (transistor body channel) that is part of portion 343 next to a respective structure 384. In each of transistors 286, the channel length of the body channel is proportional to thickness 383 of conductive plate 380. Thus, the channel length can be selected by selecting the value for thickness 383 of conductive plate 380. Therefore, thickness 383 conductive plate 380 can be selected at a relatively higher value (e.g., 150 nm (nanometer)), so that the channel length of the body channel of each of transistors 286 can also have a relatively higher value (e.g., 150 nm). The higher value of the channel length allows transistors 286 to absorb process variations in order to maintain the intended functions (e.g., GIDL current generation) and maintain the reliability of memory device 200.

Further, the FET structure of transistors 286 allows the thickness of the gate oxide (e.g., structure 384) of each of transistors 286 to be selected. For example, the thickness of the gate oxide can be selected at a relatively higher value to allow a high amount of GIDL current to be generated during an erase operation of memory device 200. Moreover, since transistors 286 have FET structures, their threshold voltages may be relatively unchanged over time. This also helps maintain the intended GIDL current generation performed by transistors 286 in erase operations of memory device 200.

Without transistors 286 (without conductive plate 380), one or both of select gates 261 and 262 can be used to generate GIDL current for the erase operation of memory device 200. However, since select gates 261 and 262 are also used during read and write operations of memory device 200, using select gates 261 and 262 to perform an additional function (e.g., to generate GIDL current for erase operations) may put more stress (e.g., electric field stress) on select gates 261 and 262. The stress may be caused by a relatively high voltage (e.g., 15V to 17V) applied to select gates 261 and 262 if they are used generate GIDL current for erase operations. The stress may degrade the structures of select gates 261 and 262. This may decrease the performance (e.g., reliability) of memory device 200. By including transistors 286 in memory device 200 and using them as GIDL current generators for erase operations (instead of using select gates 261 and 262), select gates 261 and 262 may maintain their structures and operations.

Further, if select gates 261 and 262 have similar structures (e.g., structure having charge storage elements (e.g., $Si_3N_4$)) as the structures of memory cells 210, 211, 212, and 213, and select gates 261 and 262 are used to generate GIDL current for the erase operation, process variations may cause select gates 261 and 262 to be less reliable as GIDL generators during erase operations. Plus, if select gates 261 and 262 have memory cell structures, the threshold voltages of select gates 261 and 262 (e.g., charge in the memory elements of select gates 261 and 262) may gradually vary. This may affect the operations of select gates 261 and 262 and may lead to potential changes on intended value of the GIDL current generated using select gates 261 and 262.

Moreover, if select gates 261 and 262 are formed to have similar structures as the structures of memory cells 210, 211, 212, and 213, the channel length of select gates 261 and 262 may have lower value (e.g., 30 nm). The lower value of the channel length of select gates 261 and 262 may cause them to be susceptible to process variations. For example, doping material (e.g., N+ impurity) may extend (from line 270) past the channel length of select gate 261 or 262 (or both) and may move closer to memory cell 213. This may affect the operations of select gates 261 and 262 if they are used to generate GIDL current for the erase operations and may also cause read disturbance during read operations.

FIG. 3 shows a block diagram of a top view of memory device 300 including planes 350, 351, 352, and 353 and associated conductive plates $380_0$, $380_1$, $380_2$, and $380_3$, according to some embodiments described herein. Planes 350, 351, 352, and 353 can be located over a substrate 390. Each of planes 350, 351, 352, and 353 can have it own data lines (e.g., 270, 271, and 272) and can have its own memory cell blocks (similar to blocks $203_0$ and $203_1$ of FIG. 2A through FIG. 2G). The memory cell blocks within a particular plane share the data lines associated with that particular plane. The memory cell blocks within a particular plane can share the conductive plate in that particular plane. FIG. 3 shows memory device 300 having four planes 350, 351, 352, and 353 as an example. The number of planes can vary. For simplicity, FIG. 3 shows only three lines (e.g., data lines) 270, 271, and 272 in each of planes 350, 351, 352, and 353. The number of data lines associated with each plane can vary.

Each of conductive plates $380_0$, $380_1$, $380_2$, and $380_3$ can correspond to conductive plate 380 of FIG. 2E and FIG. 2F. During an operation (e.g., read, write, or erase operations) of memory device 300, the lines that include conductive plates $380_0$, $380_1$, $380_2$, and $380_3$ can be decoded (e.g., selectively activated) based on the identifications (e.g., ID numbers) assigned to planes 350, 351, 352, and 353. For example, if a memory cell block in plane 350 is selected during an operation of memory device 300, then the line that includes conductive plate $380_0$ can be decoded. In this example, in plane 350, the waveforms of the signal (e.g., $SDG_{PLATE}$) on conductive plate $380_0$ and signals (e.g., BL0, BL1, and BL2) on lines 270, 271, and 272 can be similar to those of the signals shown in FIG. 2D.

FIG. 4A shows a block diagram of a top view of memory device 400 including multiple (e.g., separate) conductive plates in each of planes 350, 351, 352, and 353, according to some embodiments described herein. Each of planes 350, 351, 352, and 353 of memory device 400 can include memory cell blocks similar to those of memory device 300. However, unlike memory device 300, each of planes 350, 351, 352, and 353 of memory device 400 can have multiple conductive plates (e.g., separate conductive plates). For example, as shown in FIG. 4A, plane 350 can include conductive plates $480_0$, $480_1$, $480_2$, and $480_3$ (collected referred to as conductive plates 480) that are separate from among each other. Planes 351 can include conductive plates $481_0$, $481_1$, $481_2$, and $481_3$ (collected referred to as conductive plates 481) that are separate from among each other. Plane 352 can include conductive plates $482_0$, $482_1$, $482_2$, and $482_3$ (collected referred to as conductive plates 482) that are separate from among each other. Plane 353 can include conductive plates $483_0$, $483_1$, $483_2$, and $483_3$ (collected referred to as conductive plates 483) that are separate from among each other. FIG. 4A shows four conductive plates in each of planes 350, 351, 352, and 353 as an example. The number of conductive plates in each plane can vary.

Each of conductive plates of each of planes 350, 351, 352, and 353 can correspond to conductive plate 380 of FIG. 2E and FIG. 2F and can be part of a line similar to line 280 of FIG. 2A and FIG. 2B. For example, in plane 350, conductive plates $480_0$, $480_1$, $480_2$, and $480_3$ can correspond to conductive plate 380 of FIG. 2E. Conductive plates $480_0$, $480_1$, $480_2$, and $480_3$ and can be located immediately next to lines 270, 271, and 272 and in between substrate 390 and lines 270, 271, and 272. In FIG. 4A, each conductive plate of a particular plane can be associated with memory cell strings with in only a portion (e.g., fewer than all) of memory cell strings blocks in that particular plane. The portion of the memory cell strings can be included in a single memory cell block or in multiple memory cell blocks.

As shown in FIG. 4A, each of the conductive plates can be provided with a respective signal among signals $SDG_{PLATE\_0}$, $SDG_{PLATE\_1}$, $SDG_{PLATE\_2}$, and $SDG_{PLATE\_3}$. During an operation (e.g., read, write, or erase operations) of memory device 400, a particular line that include a corresponding conductive plate of a particular plane can be decoded based on the identification (e.g., ID number) assigned to that particular plane and based on the block number of a selected memory cell block associated with that particular line.

Figure 4B:
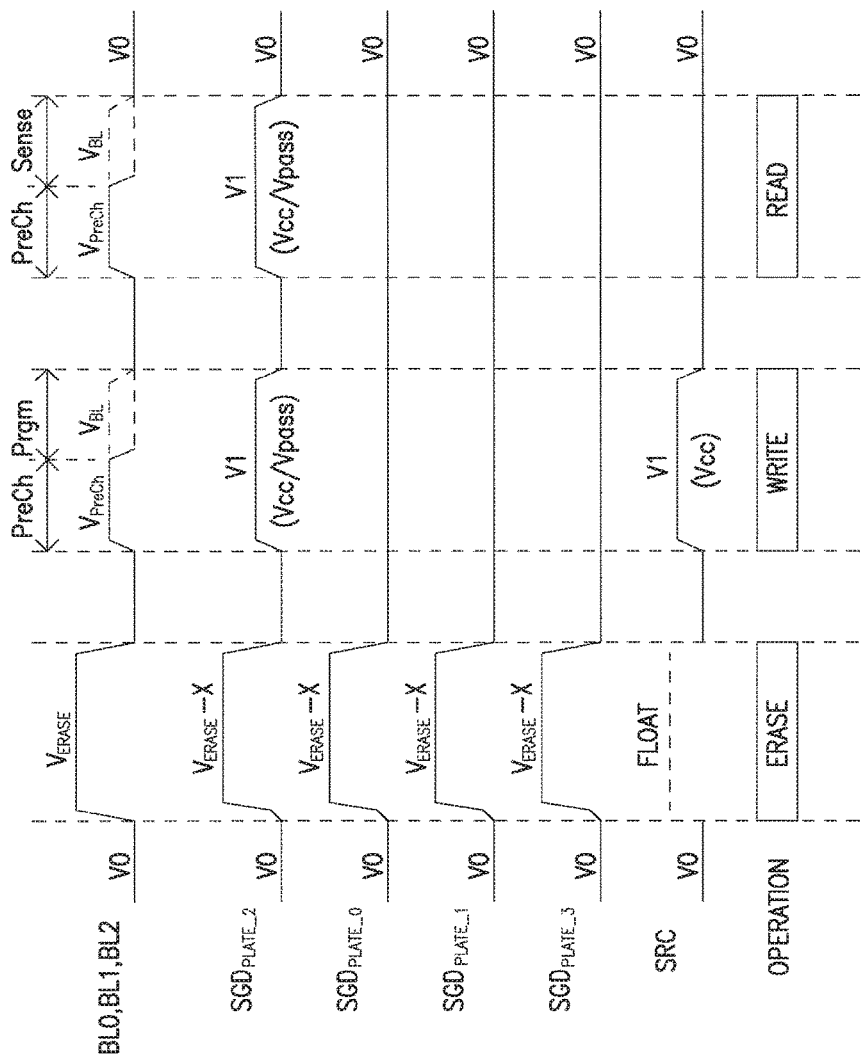
FIG. 4B shows example waveforms of some signals of the memory device of FIG. 4A during example erase, write, and read operations, according to some embodiments described herein.

FIG. 4B shows example waveforms of signals BL0, BL1, BL2, $SDG_{PLATE\_0}$, $SDG_{PLATE\_1}$, $SDG_{PLATE\_2}$, $SDG_{PLATE\_3}$, and SRC of memory device 400 of FIG. 4A during example erase, write, and read operations, according to some embodiments described herein. FIG. 4B omits other signals of memory device 400 (e.g., signals similar to the signals shown in FIG. 2C) to help focus on the embodiments of the memory device described herein. During erase, write, and read operations, the omitted signals (e.g., $SGD_A$, $SGD_B$, $SGS_A$, and $SGS_B$) can have waveforms with values shown in FIG. 2D.

In the example associated with FIG. 4B, it is assumed that a memory cell block associated with conductive plate $480_2$ in plane 350 is selected during erase, write, and read operations of memory device 400. In this example, the lines that include conductive plates $480_0$, $480_1$, $480_2$, and $480_3$ can be decoded (e.g., activated) during an erase operation and their respective signals ($SDG_{PLATE\_0}$, $SDG_{PLATE\_1}$, $SDG_{PLATE\_2}$, and $SDG_{PLATE\_3}$) can be provided with voltage $V_{ERASE}$–X (as shown in FIG. 4B). This allows all of the transistors (e.g., similar to transistors 286 in FIG. 2C) associated with conductive plates $480_0$, $480_1$, $480_2$, and $480_3$ to generate GIDL current for the erase operation of the selected memory cell block associated with conductive plate $480_2$ in plane 350.

Figure 5A:
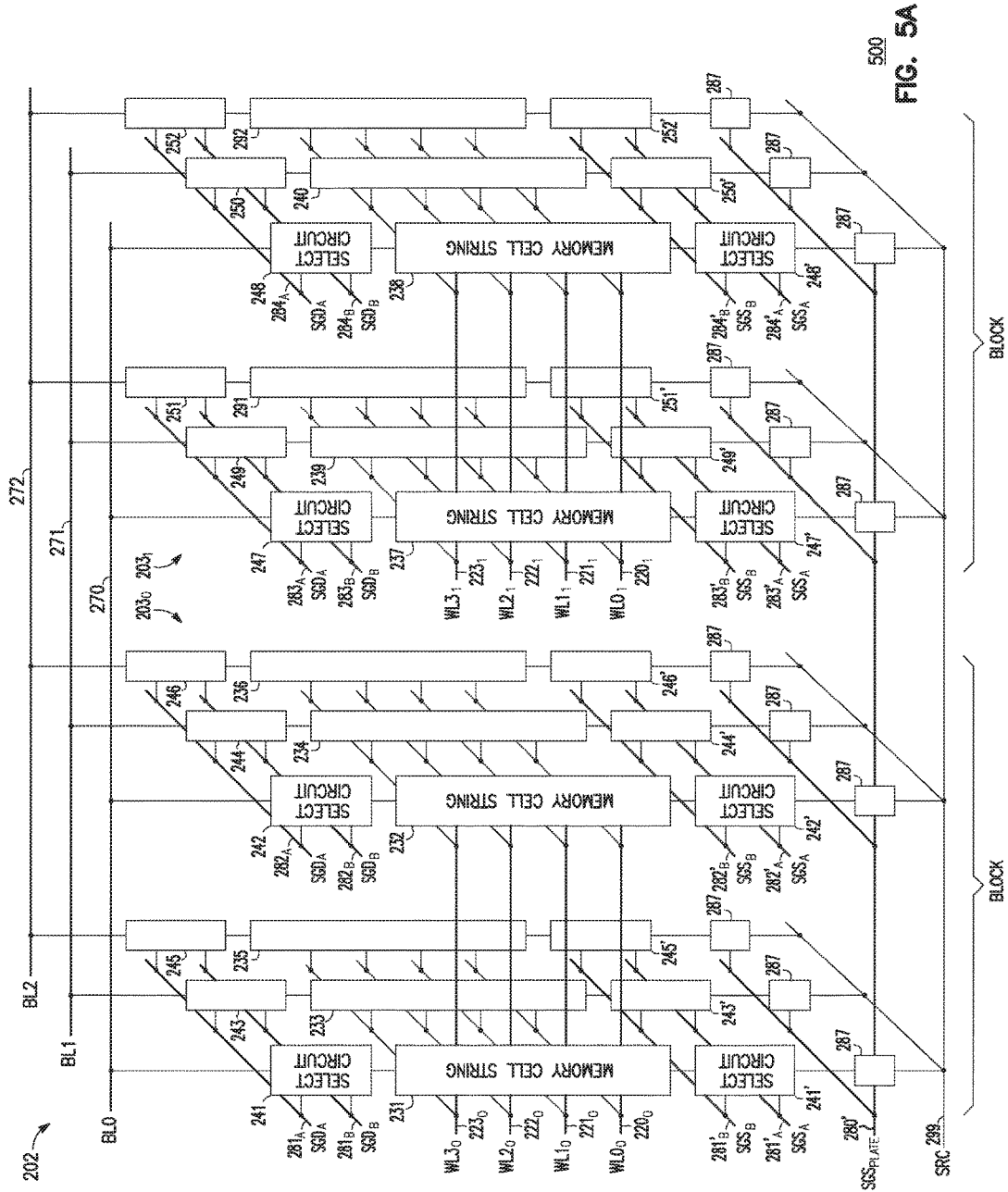
FIG. 5A shows a block diagram of a portion of a memory device, which can be a variation of memory device 200 of FIG. 2A, according to some embodiments described herein.

During write and read operations, the line that include conductive plate $480_2$ (associated with a selected memory cell block in this example) can also be activated, such that is respective signal ($SDG_{PLATE\_2}$) can be provided with voltage V1. However, during write and read operations, the lines that include conductive plates $480_0$, $480_1$, and $480_3$ (associated with deselected memory cell blocks in this example) can be deactivated, such that their respective signals ($SDG_{PLATE\_0}$, $SDG_{PLATE\_1}$, and $SDG_{PLATE\_3}$) can be provided with 0 volts. This may prevent the capacitances of the lines that include conductive plates $480_0$, $480_1$, and $480_3$ from being added to the capacitances of lines (e.g., data lines) 270, 271, and 272. Therefore, the line (e.g., line 270) associated with the selected memory cell block during write and read operations may not be influenced by the capacitances of the lines that include the conductive plates (conductive plates $480_0$, $480_1$, and $480_3$) associated with deselected memory cell blocks FIG. 5A shows a block diagram of a portion of a memory device 500, which can be a variation of memory device 200 of FIG. 2A, according to some embodiments described herein. Memory device 500 includes elements similar to or identical to those of memory device 200. For simplicity, the description of similar or identical elements between memory device 500 (FIG. 5A through FIG. 5F) and memory device 200 (FIG. 2A through FIG. 2G) is not repeated in the description of FIG. 5A through FIG. 5F.

As shown in FIG. 5A, memory device 500 can include circuits 287 located between line 299 and select circuits 241', 242', 243', and 244'. Circuits 287 are similar to circuits 285 of memory device 200 (FIG. 2A). However, as shown in FIG. 5A, circuits 287 of memory device 500 are located next to line (e.g., source line) 299, whereas circuits 285 of memory device 200 are located next to lines (e.g., data lines) 270, 271, and 272.

In memory device 500, each of circuits 287 can be coupled in series with a respective select circuit (among select circuits 241' through 252') between line 299 and a respective memory string (among memory cell strings 231 through 240, 291, and 292). Circuits 287 can share a line 280', such that the same signal (e.g., signal $SGS_{PLATE}$) provided to line 280' can be used to control (activate or deactivate) all of circuits 287. For example, during an operation (e.g., read, write, or erase operation) of memory device 500, signal $SGS_{PLATE}$ can be used to concurrently activate circuits 287.

Figure 5B:
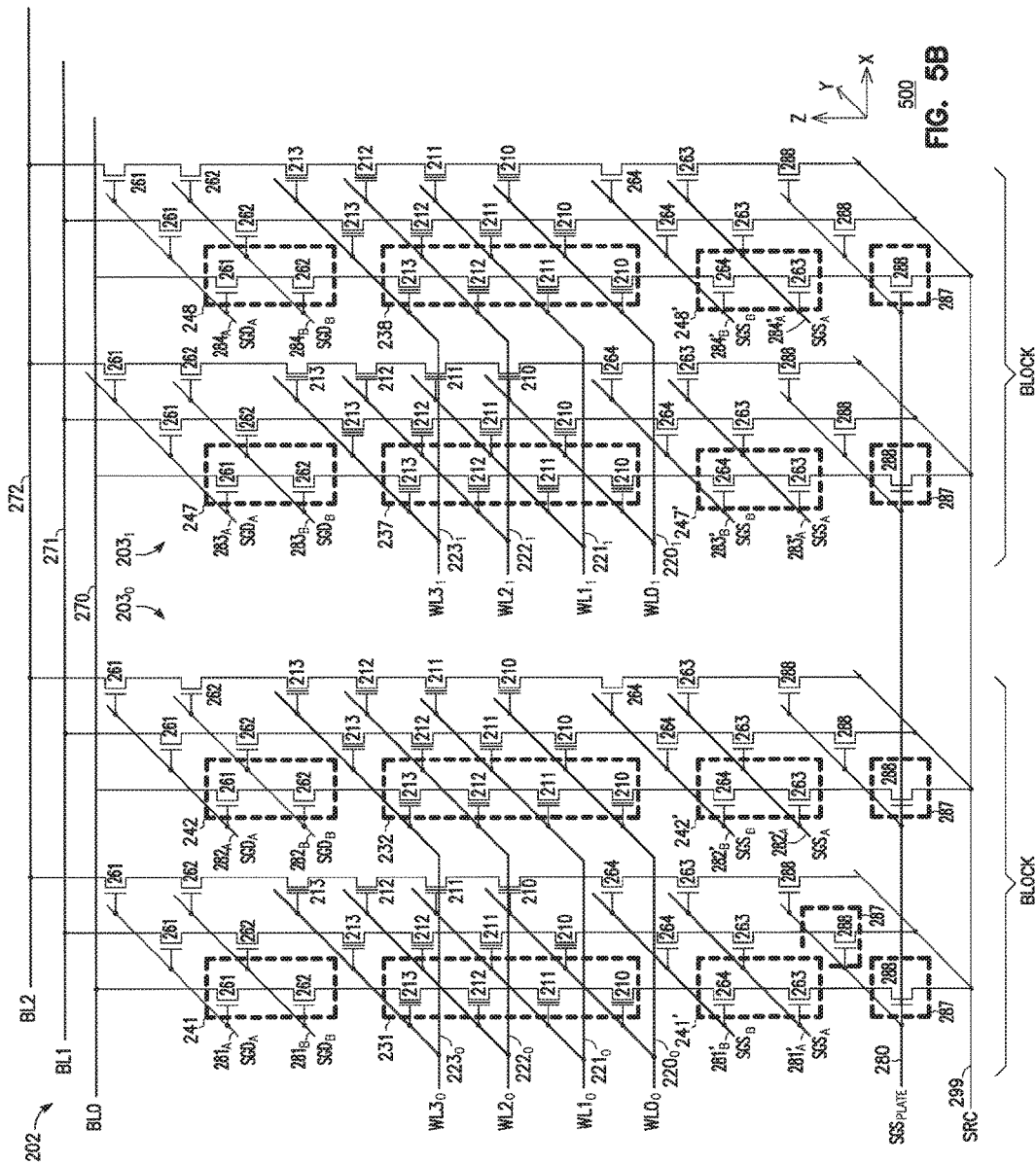
FIG. 5B shows a schematic diagram of the memory device of FIG. 5A, according to some embodiments described herein.

FIG. 5B shows schematic diagram of memory device 500 of FIG. 5A, according to some embodiments described herein. Memory device 500 includes elements similar to or identical to those of memory device 200 of FIG. 2B. As shown in FIG. 5B, circuits 287 can include transistors 288, such that each of circuits 287 includes a respective transistor among transistors 288. For simplicity, fewer than all of circuits 287 are labeled in FIG. 5B. Each of transistors 288 can be a FET. Line 280' can be coupled to the gate of each of transistors 288. Thus, the same signal $SGS_{PLATE}$ can be used to control (e.g., turn on or turn off) transistors 288.

Figure 5C:
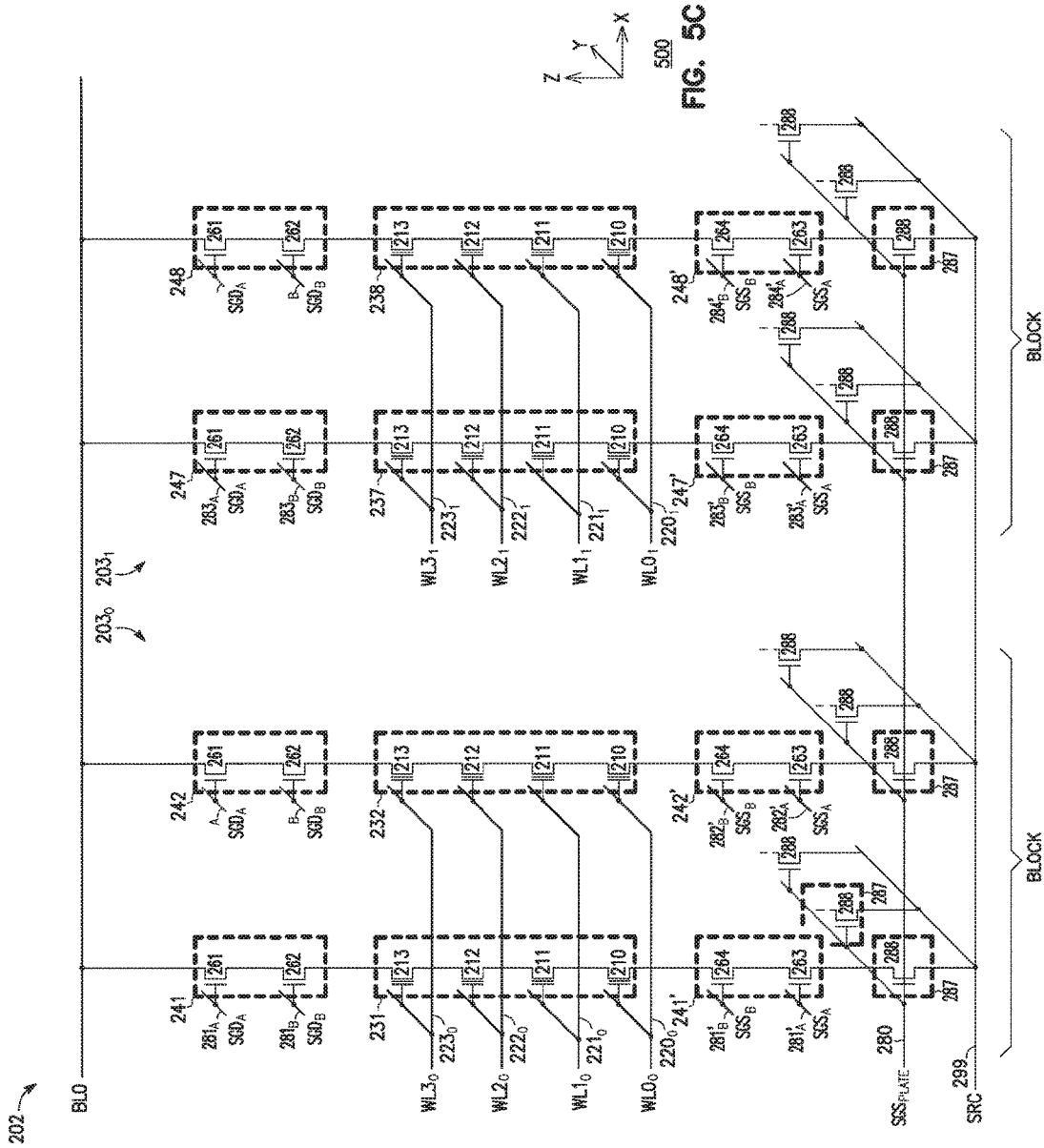
FIG. 5C shows a schematic diagram of a portion of a memory device of FIG. 5B, according to some embodiments described herein.

FIG. 5C shows a schematic diagram of a portion of memory device 500 of FIG. 5B including line 270, select circuits 241, 242, 247, 248, memory cell strings 231, 232, 237, and 238, select circuits 241', 242', 247', 248', circuits 287, and line 299. As shown in FIG. 5C, select gates 261 and 262 of each of select circuits 241, 242, 247, and 248 can be coupled in between line 270 and a respective memory cell string among memory cell strings 231, 232, 237, and 238. Select gates 263 and 264 of each of select circuits 241', 242', 247', and 248' can be coupled in series with one of transistors 288 between line 299 and a respective memory cell string among memory cell strings 231, 232, 237, and 238.

Figure 5D:
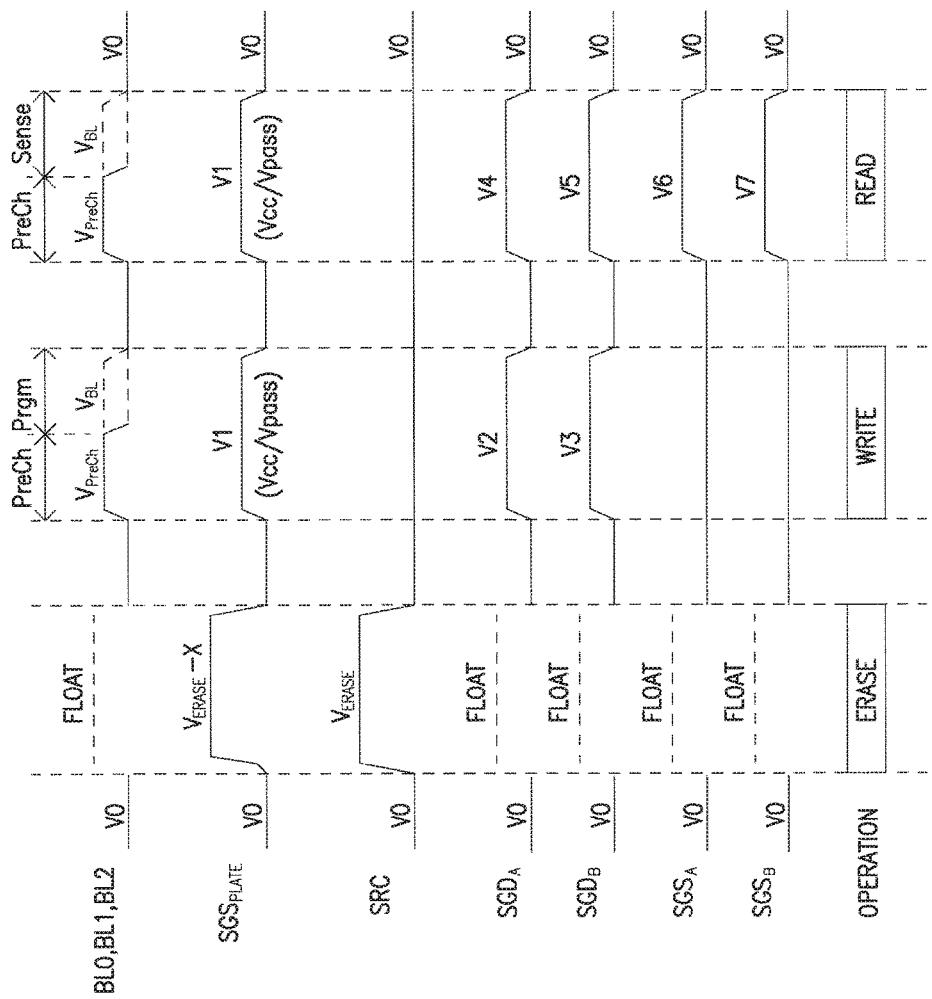
FIG. 5D shows example waveforms of some signals of the memory device of FIG. 5A through FIG. 5C during example erase, write, and read operations, according to some embodiments described herein.

FIG. 5D shows example waveforms of signals BL0, BL1, BL2, $SGS_{PLATE}$, SRC, $SGD_A$, $SGD_B$, $SGS_A$, and $SGS_B$ of memory device 500 of FIG. 5A through FIG. 5C during example erase, write, and read operations, according to some embodiments described herein. FIG. 5D omits other signals of memory device 500 (e.g., signals shown in FIG. 5C) to help focus on the embodiments of the memory device described herein. During erase, write, and read operations, the omitted signals can be provided with voltages having values known to those skilled in the art.

The waveforms (during write and read operations) of FIG. 5D are similar to those of FIG. 2D except for the waveforms of signals SRC, BL0, BL1, and BL2 during the erase operation. For example, as shown in FIG. 5D, during the erase operation, signal $SGS_{PLATE}$ can be provided with a voltage $V_{ERASE}-X$ and lines 270, 271, and 272 (FIG. 5C) used to provide signals BL0, BL1, and BL2, respectively, can be placed in a float state. In the float state, lines 270, 271, and 272 can be decoupled from a bias voltage (decoupled from a DC voltage source). This decoupling allows the value of the voltage on each of lines 270, 271, and 272 to be proportionally to the value of voltage $V_{ERASE}$. For example, if voltage $V_{ERASE}$ has a value of 20V, then the voltage on each of lines 270, 271, and 272 can be approximately between 15V to 20V.

During the erase operation, transistors 288 (FIG. 5C) can operate GIDL current generators to help the erase operation. For example, the GIDL current generated by transistors 286 during the erase operation may speed up the charging of the body of the memory cell strings in the selected block in preparation for information in memory cells of the memory cell strings of the selected block to be erased. Select gates 263 and 264 may be not be used for generating GIDL current during the erase operation. Not using select gates 263 and 264 for generating GIDL current during an erase operation in memory device 500 may prevent select gates 263 and 264 from potential degradation. This may help maintain the reliability of memory device 500.

Figure 5E:
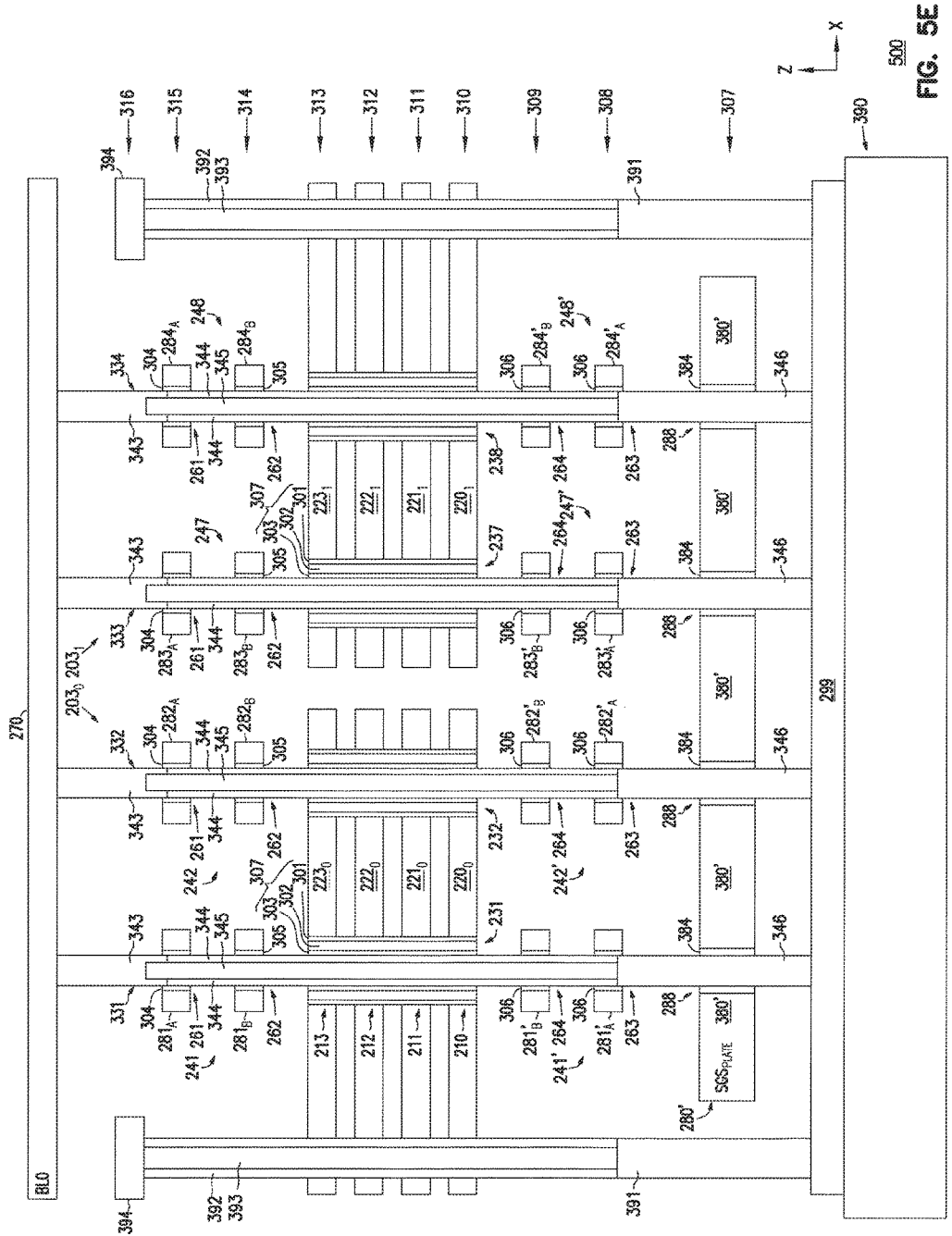
FIG. 5E shows a side view of a structure of a portion of the memory device of FIG. 5A through FIG. 5C, according to some embodiments described herein.

FIG. 5E shows a side view of a structure of a portion of memory device 500, according to some embodiments described herein. The structure of memory device 500 in FIG. 5E corresponds to part of the schematic diagram of memory device 500 shown in FIG. 5C. The portion of memory device 500 shown in FIG. 5E includes elements similar to or identical to those of memory device 200 of FIG. 2E. As shown in FIG. 5E, line 280' can include a conductive plate (e.g., SGS conductive plate) 380'. Conductive plate 380' is similar to conductive plate 280' of memory device 200 in FIG. 2E. However, as shown in FIG. 5E, conductive plate 380' is located next to line (e.g., source line) 299, whereas conductive plate 380 (FIG. 2E) is located next to line (e.g., data line) 270.

FIG. 5F shows a top view of a structure of a portion of memory device 500 of FIG. 5E, according to some embodiments described herein. The side view of the portion of memory device 500 of FIG. 5E is taken along cut line 5E-5E of FIG. 5F. As shown in FIG. 5F, memory device 500 can include plane 550 (which can be similar to one of planes 350, 351, 352, and 353) of memory device 400 of FIG. 4A. Memory device 500 of FIG. 5F can include two conductive plates 380'. For simplicity, a side view of only one of two conductive plates 380' is shown in FIG. 2E.

As shown in FIG. 5F, each of conductive plates 380', can be line 270 and also below other components of memory device 200. For example, conductive plate 380' on the left side of plane 550 is drain select lines $281_A$, $282_A$, $283_A$, $284_A$, $281_B$, $282_B$, $283_B$, and $284_B$ and below source select lines $281'_A$, $282'_A$, $283'_A$, $284'_A$, $281'_B$, $282'_B$, $283'_B$, and $284'_B$. Conductive plate 380' on the right side of plane 550 is also below its respective drain and source select lines (not labeled in FIG. 5F). FIG. 5F shows memory device 500 having one plane 550 and two conductive plates 380' as an example. The number planes and conductive plates in each plane 550 can vary.

As shown in FIG. 5F, memory device 500 can have spaces at edges (e.g., left and right edges) 501 and 502 of plane 550. Memory device 500 can also have a space 503 that is void of the materials of conductive plates 380'. Spaces 501, 502, and 503 allow vertical columns (in the z-direction) formed by portions 391, 392, and 393 (FIG. 5E) to form electrical connections between line (e.g., source) 299 and portion 394. Forming memory device 500 to include conductive plate 380' may allow memory device to have improvements similar to memory device 200 described above with reference to FIG. 2A through FIG. 2G.

FIG. 6A through FIG. 6E show processes of forming a memory device 600 including an SGD conductive plate, according to some embodiments described herein. The processes of forming memory device 600 in FIG. 6A through FIG. 6E can be used to form memory device 200 (FIG. 2A through FIG. 2G). Some of the processes of forming memory device 600 and some of the elements of memory device 600 may be readily known to those skilled in the art. Thus, to help focus on the embodiments described herein, some of the processes of forming memory device 600 shown FIG. 6A through FIG. 6E and additional processes to complete memory device 600 are omitted. Further, for simplicity, similar or identical elements among memory devices 200 (FIG. 2A through FIG. 2G) and memory device 600 (FIG. 6A through FIG. 6E) are given the same labels.

Figure 6A:
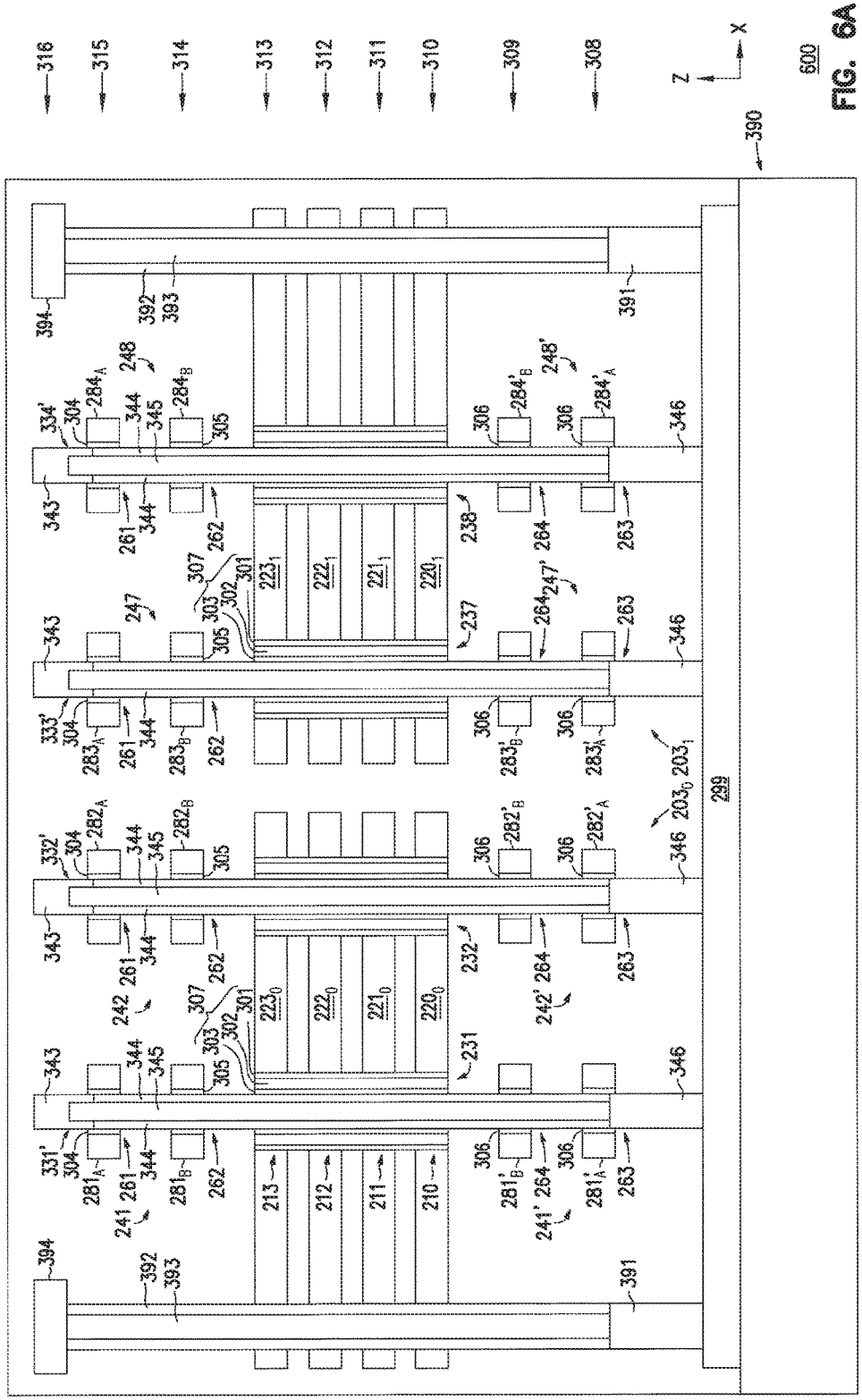

FIG. 6A shows memory device 600 after some components are formed. The components of memory device 600 are similar to those of memory device 200 in FIG. 2E, except for conductive plate 380 and line 270 of FIG. 2E. FIG. 6A shows an example where the drain select gates (e.g., 261 and 262) and the source select gates (e.g., 263 and 264) have FET structures. However, in an alternative arrangement, the drain and source select gates can have the same structures as memory cells 210, 211, 212, and 213. In the alternative arrangement, the drain select lines (e.g., $281_A$, $282_A$, $283_A$, $284_A$, $281_B$, $282_B$, $283_B$, and $284_B$), the source select lines ($281'_A$, $282'_A$, $283'_A$, $284'_A$, $281'_B$, $282'_B$, $283'_B$, and $284'_B$), and the control lines (e.g., $220_0$, $221_0$, $222_0$, $223_0$, $220_1$, $221_1$, $222_1$, and $223_1$) can be formed from metal (e.g., tungsten). Such metal drain select lines, metal source select lines, and metal control lines can be formed concurrently (e.g., formed by the same process step (or steps)).

As an example, a damascene process may be used in the alternative arrangement (mentioned above) to form metal drain select lines, metal source select lines, and metal control lines. Such damascene process (not shown in FIG. 6A) may include forming initial alternating layers of materials $Si_3N_4$ and $SiO_2$ between material 602 (e.g., dielectric material) and line 299. The layers of materials $Si_3N_4$ can be located in the levels (e.g., on each of levels 308 to 315 in FIG. 6A) where respective drain select lines, source select lines, and control lines of memory device 600 (in FIG. 6A) are located. Then, after memory cells 210, 211, 212, and 213 and pillar portions 331', 332', 333', and 334' are formed, materials $Si_3N_4$ (which are included in the initial alternating layers of materials $Si_3N_4$ and $SiO_2$) can be removed (e.g., by etching). Removing materials $Si_3N_4$ can include forming holes (and damascene slits) in the alternating layers of materials $Si_3N_4$ and $SiO_2$. Materials $Si_3N_4$ can be subsequently etched away through the holes. After the removal of materials $Si_3N_4$, metal (e.g., tungsten or other metals) may be formed (e.g., filled) in the vacancies on the levels (e.g., on each of levels 308 to 315 in FIG. 6A) where materials $Si_3N_4$ were removed. The metals on each of levels 308 to 315 in FIG. 6A form the respective drain select lines, source select lines, and control lines of memory device 600 (in FIG. 6A) in the alternative arrangement.

Figure 6B:
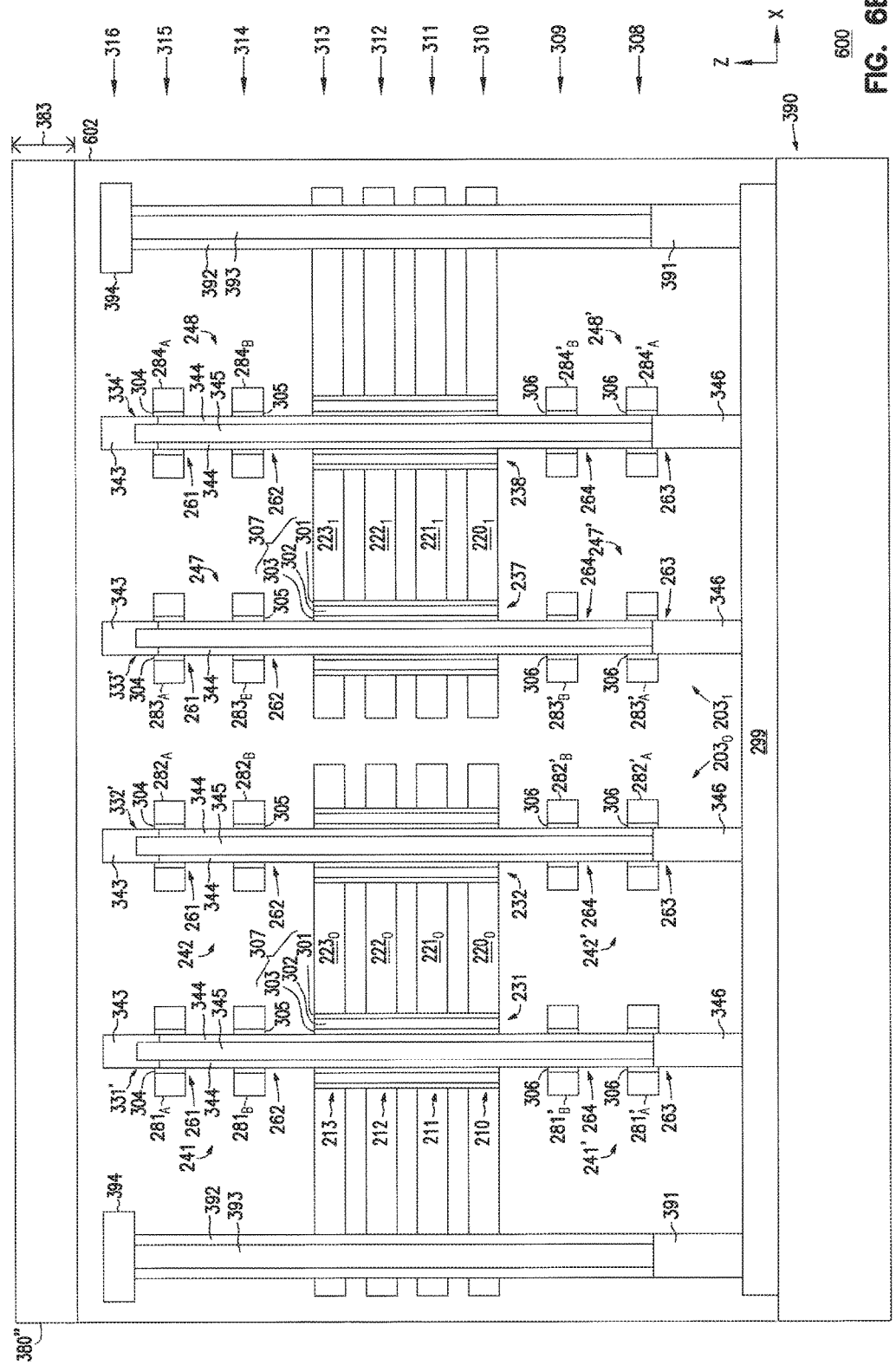

FIG. 6B shows memory device 600 after conductive material 380" is formed. Conductive material 380" can include polycrystalline silicon (e.g., doped polycrystalline silicon of n-type or p-type). Alternatively, conductive material 380" can include metal or other conductive materials. As shown in FIG. 6B, conductive material 380" has a thickness 383 (in the z-dimension). Since conductive material 380" is formed after select gates (e.g., drain select gates) 261 and 262 are formed, thickness 383 can be selected to be greater than the thickness (in the z-dimension) of each of select gates (e.g., drain select gates) 261 and 262 and each of control lines $220_0$, $221_0$, $222_0$, $223_0$, $220_1$, $221_1$, $222_1$, and $223_1$. A greater thickness 383 may allow the transistors 286 (FIG. 6E) that are formed from part of material 380" to have a relatively greater channel length to improve the structures and operations of the transistors 286 (as described above with reference to FIG. 2E).

FIG. 6C shows memory device 600 after conductive plate 380 and holes 606 are formed. Conductive plate 380 is formed from part of conductive material 380". Holes 606 are formed at selective locations of conductive plate 380 to expose pillar portions 331', 332', 333', and 334' at respective bottoms of holes 606.

Figure 6D:
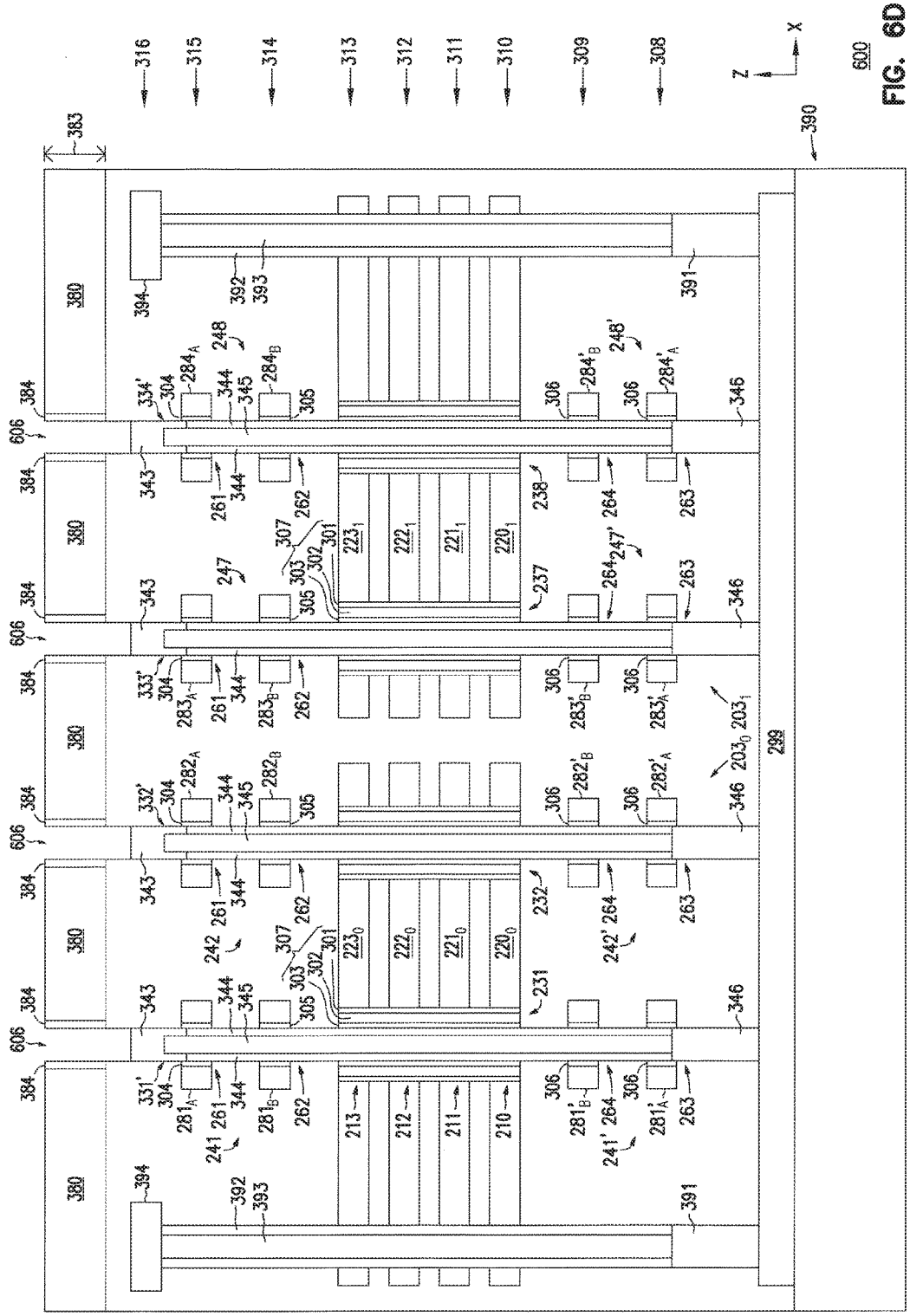

FIG. 6D shows memory device 600 after structures 384 are formed. Structures 384 include oxide (e.g., $SiO_2$) material that can be gate oxides of respective transistors (shown in FIG. 6E) that are formed in subsequent processes. Forming structures 384 can include oxidizing the sidewalls (e.g., vertical sidewalls in the z-dimension) of holes 606.

Figure 6E:
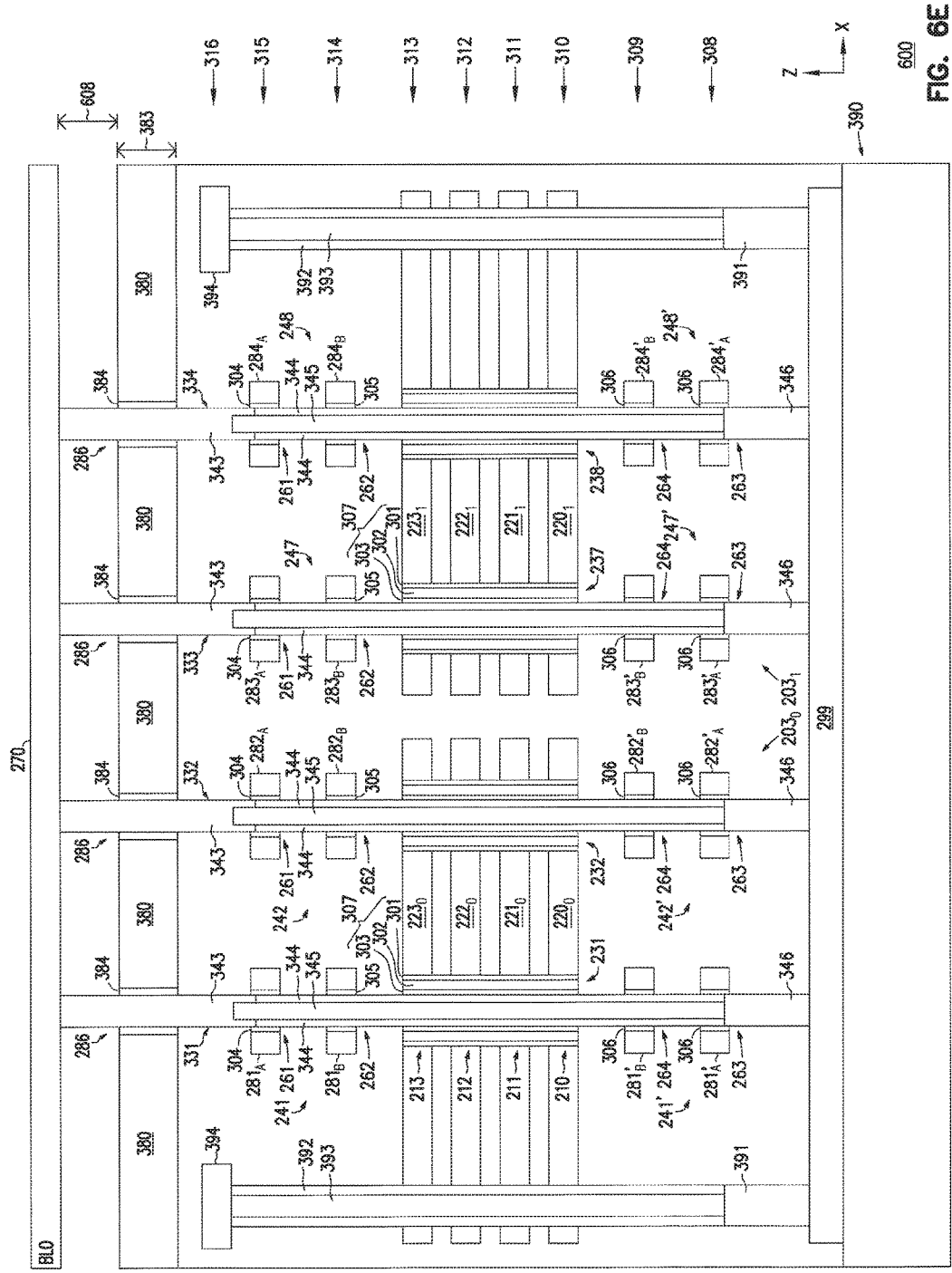

FIG. 6E shows memory device 600 after pillars 331, 332, 333, and 334, transistors 286, and line (e.g., data line) 270 are formed. Forming pillars 331, 332, 333, and 334 can include forming (e.g., by depositing) additional conductive material in holes 606 (FIG. 6D) on pillar portions 331', 332', 333', and 334'. Forming line 270 can include depositing conductive material contacting pillars 331, 332, 333, and 334. Line 270 can be formed over portion 381 (e.g., $SiO_2$) between line 270 and conductive plate 380.

As shown in FIG. 6E, each of transistors 286 can include a respective portion (e.g., a transistor gate) of conductive plate 380, one of structures 384, and a portion (e.g., transistor body channel) of a respective pillar among pillars 331, 332, 333, and 334. Forming memory device 600 to include conductive plate 380 may allow memory device to have improvements similar to memory device 200 described above with reference to FIG. 2A through FIG. 2G.

Figure 7B:
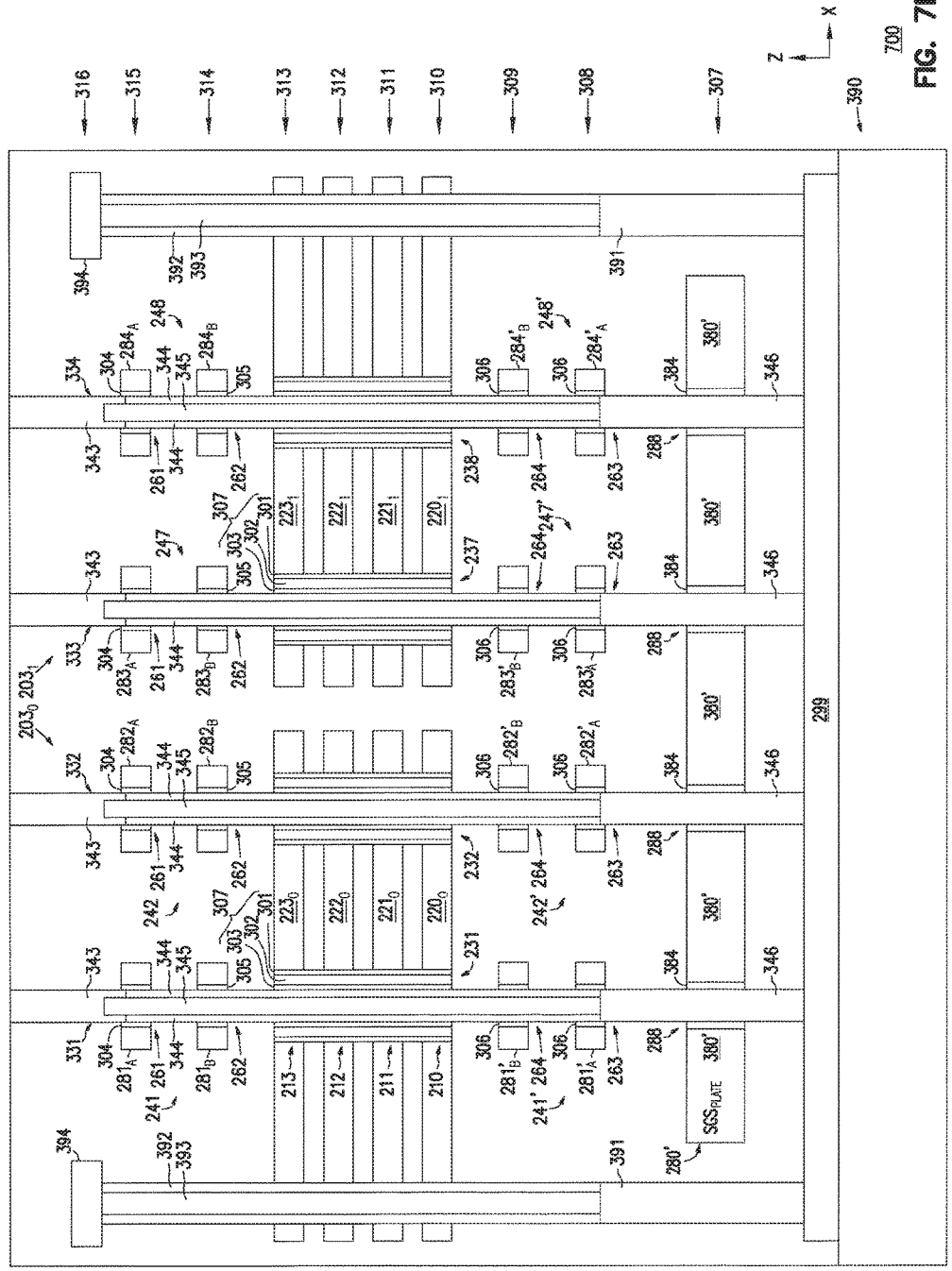
Figure 7C:
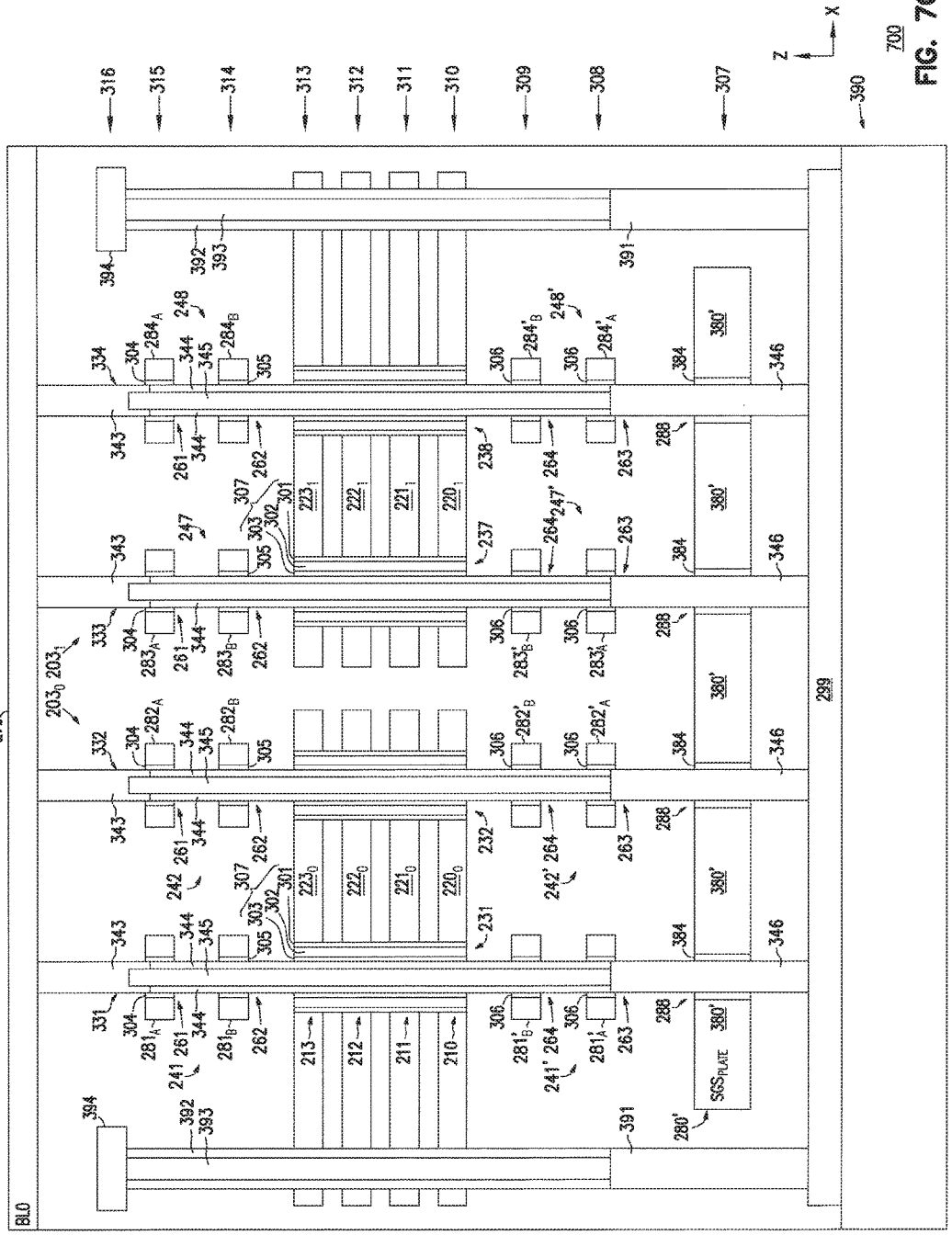

FIG. 7A through FIG. 7C show processes of forming a memory device 700 including an SGS conductive plate, according to some embodiments described herein. The processes of forming memory device 700 in FIG. 7A through FIG. 7C can be used to form memory device 500 (FIG. 5A through FIG. 5F). Some of the processes of forming memory device 700 and some of the elements of memory device 700 may be readily known to those skilled in the art. Thus, to help focus on the embodiments described herein, some of the processes of forming memory device 700 shown FIG. 7A through FIG. 7C and additional processes to complete memory device 700 are omitted. Further, for simplicity, similar or identical elements among memory devices 200 (FIG. 2A through FIG. 2G) 500 (FIG. 5A through FIG. 5F) and memory devices 700 (FIG. 7A through FIG. C) are given the same labels.

FIG. 7A shows memory device 700 after conductive plate 380' and transistors 288 are formed over line 299. Conductive plate 380' can include polycrystalline silicon (e.g., doped polycrystalline silicon of n-type or p-type). Alternatively, conductive plate 380' can include metal or other conductive materials.

FIG. 7B shows memory device 700 after select gates (e.g., source select gates) 263 and 264, memory cells 210, 211, 212, and 213, control lines $220_0$, $221_0$, $222_0$, $223_0$, $220_1$, $221_1$, $222_1$, and $223_1$, and select gates (e.g., select gates) 261 and 262 are formed. Pillar portions 331', 332', 333', and 334' are also formed. FIG. 7B shows an example where the select gates 261, 262, 263 and 264 have FET structures. However, in an alternative arrangement, the drain and source select gates can have the same structures as memory cells 210, 211, 212, and 213. In the alternative arrangement, the drain and source select gates can have the same structures as memory cells 210, 211, 212, and 213. In the alternative arrangement, select lines (e.g., drain select lines) $281_A$, $282_A$, $283_A$, $284_A$, $281_B$, $282_B$, $283_B$, and $284_B$, select lines (e.g., source select lines) $281'_A$, $282'_A$, $283'_A$, $284'_A$, $281'_B$, $282'_B$, $283'_B$, and $284'_B$), and control lines $220_0$, $221_0$, $222_0$, $223_0$, lines $220_1$, $221_1$, $222_1$, and $223_1$ can be formed from metal (e.g., tungsten) and can be formed by a process (e.g., damascene process) similar to that described above with reference to FIG. 6A.

FIG. 7C shows memory device 700 after line 270 and pillars 331, 332, 333, and 334 are formed. Forming memory device 700 to include conductive plate 380' may allow memory device 700 to have improvements similar to memory device 500 described above with reference to FIG. 5A through FIG. 5F.

Figure 8:
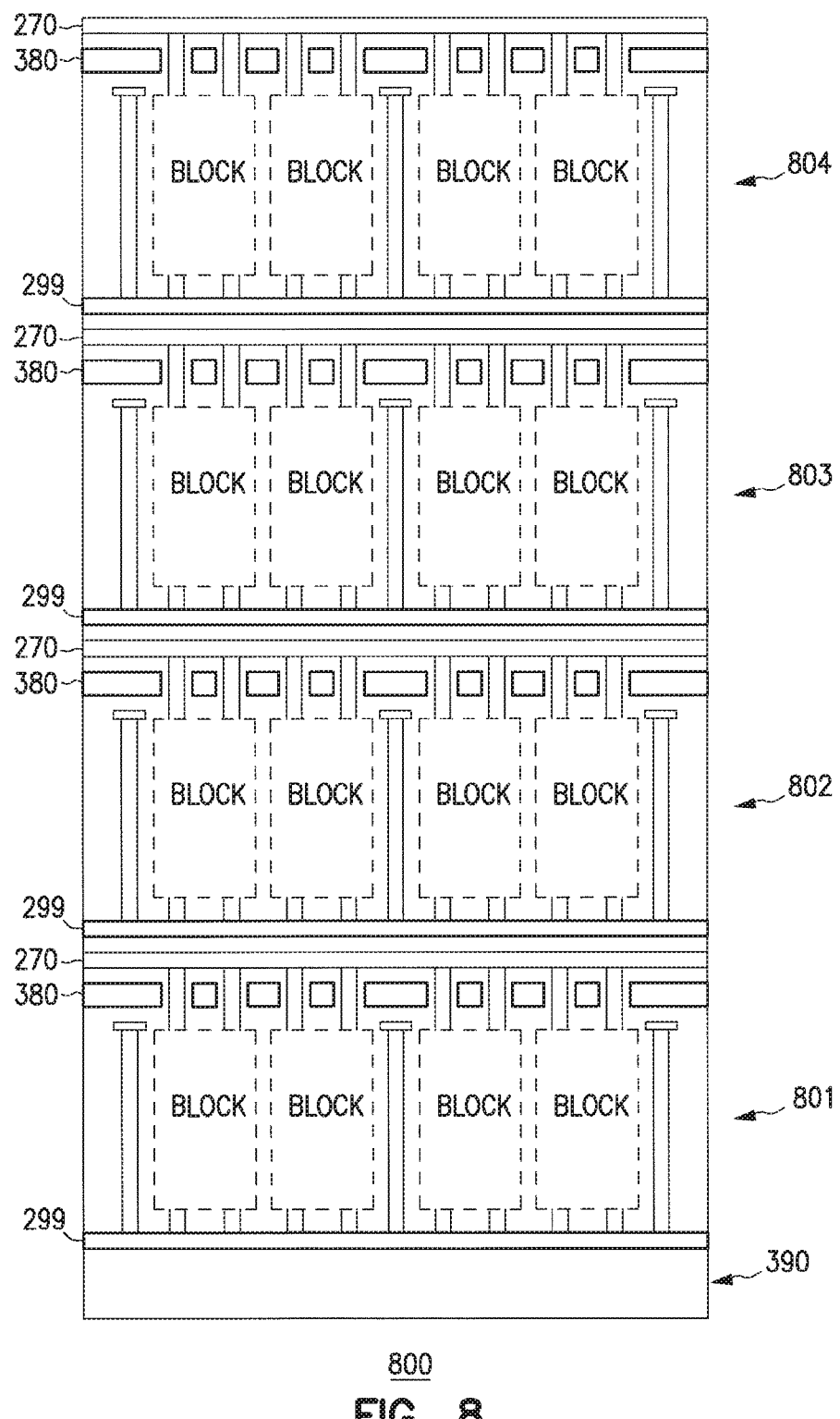
FIG. 8 shows a memory device including multiple decks, according to some embodiments described herein.

FIG. 8 shows a memory device 800 including multiple decks 801, 802, 803, and 804, according to some embodiments described herein. Each of decks 801, 802, 803, and 804 can include components similar to or identical to the components of memory device 200 of FIG. 2E. Thus, for simplicity, only outlines of some portions of each of decks 801, 802, 803, and 804 are shown in FIG. 8. FIG. 8 shows each of decks 801, 802, 803, and 804 including conductive plate 380 of FIG. 2E (or FIG. 6E) as an example. Alternatively, each of deck can include a conductive plate similar to conductive plate 380' of FIG. 5E (or FIG. 7C).

As shown in FIG. 8, decks 801, 802, 803, and 804 can be arranged vertically among each other (e.g., arranged in a stack) over substrate 390. This arrangement allows memory device 800 to have a relatively higher storage capacity (e.g., a higher number of memory cells).

Each of decks 801, 802, 803, and 804 may be formed by a damascene process (as described above with reference to FIG. 2E). In such damascene process, holes are formed to remove $Si_3N_4$ in the alternating layers of materials $Si_3N_4$ and $SiO_2$ (as described above with reference to FIG. 6A). Each of such holes has an aspect ratio (hole diameter relative to hole depth) that may limit the number of levels (e.g., tiers) of memory cells formed in such process. However, the multiple decks (801, 802, 803, and 804) included in memory device 800 still allow use of the damascene process and allow a memory device to have a relatively high capacity. As an example, due to the aspect ratio of the holes used in the damascene process (to form metal select lines and metal control lines), memory cells in each of decks 801, 802, 803, and 804 may be limited to 96 levels. However, the multiple decks in memory device 800 may increase the number of the levels of memory cells by a factor equal to the number of the decks. For example, if memory device 800 has 12 decks and each of the 12 deck has 96 levels of memory cells, then the total number of the levels of memory cells in memory device 800 is 12×96=1152. Thus, the techniques described herein (e.g., forming memory cells and conductive plates) can be applicable for either a single deck structure (e.g., memory device 200, 300, 400, 500, 600, or 700) of multi-deck structure (e.g., memory device 800).

The illustrations of apparatuses (e.g., memory devices 100, 200, 400, 500, 600, 700, and 800) and methods (e.g., operating methods associated with memory devices 100, 200, 400, 500, 600, 700, and 800, and methods (e.g., processes) of forming these memory devices) are intended to provide a general understanding of the structure of various embodiments and are not intended to provide a complete description of all the elements and features of apparatuses that might make use of the structures described herein. An apparatus herein refers to, for example, either a device (e.g., any of memory devices 100, 200, 400, 500, 600, 700, and 800) or a system (e.g., a computer, a cellular phone, or other electronic system) that includes a device such as any of memory devices 100, 200, 400, 500, 600, 700, and 800.

Any of the components described above with reference to FIG. 1 through FIG. 8 can be implemented in a number of ways, including simulation via software. Thus, apparatuses (e.g., memory devices 100, 200, 400, 500, 600, 700, and 800 or part of each of these memory devices, including a control unit in these memory devices, such as control unit 116 (FIG. 1)) described above, may all be characterized as "modules" (or "module") herein. Such modules may include hardware circuitry, single and/or multi-processor circuits, memory circuits, software program modules and objects and/or firmware, and combinations thereof, as desired and/or as appropriate for particular implementations of various embodiments. For example, such modules may be included in a system operation simulation package, such as a software electrical signal simulation package, a power usage and ranges simulation package, a capacitance-inductance simulation package, a power/heat dissipation simulation package, a signal transmission-reception simulation package, and/or a combination of software and hardware used to operate or simulate the operation of various potential embodiments.

Memory devices memory devices 100, 200, 400, 500, 600, 700, and 800 may be included in apparatuses (e.g., electronic circuitry) such as high-speed computers, communication and signal processing circuitry, single or multi-processor modules, single or multiple embedded processors, multicore processors, message information switches, and application-specific modules including multilayer, multichip modules. Such apparatuses may further be included as subcomponents within a variety of other apparatuses (e.g., electronic systems), such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others.

The embodiments described above with reference to FIG. 1 through FIG. 8 include apparatuses and methods using a first conductive material located in a first level of an apparatus; a second conductive material located in a second level of the apparatus; pillars extending between the first and second levels and contacting the first and second conductive materials; memory cells located along the pillars; first select gates located in a third level of the apparatus between the first and second levels, with each of the first select gates being located along a segment of a respective pillar among the pillars; second select gates located in a fourth level of the apparatus between the first and third levels; and a conductive plate located in a fifth level of the apparatus between the first and fourth levels, with each of the pillars extending through the conductive plate. Other embodiments including additional apparatuses and methods are described.

The above description and the drawings illustrate some embodiments of the invention to enable those skilled in the art to practice the embodiments of the invention. Other embodiments may incorporate structural, logical, electrical, process, and other changes. Examples merely typify possible variations. Portions and features of some embodiments may be included in, or substituted for, those of others. Many other embodiments will be apparent to those of skill in the art upon reading and understanding the above description.

What is claimed is:

1. An apparatus comprising:
   a first data line and a second data line;
   a first select gate, a second select gate, and a first transistor coupled in series with the first and second select gates between the first data line and a first memory cell string, wherein the first select gate is directly coupled to the second select gate, and the second select gate is directly coupled to the first transistor;
   a third select gate, a fourth select gate, and a second transistor coupled in series with the third and fourth select gates between the first data line and a second memory cell string, wherein the third select gate is directly coupled to the fourth select gate, and the fourth select gate is directly coupled to the second transistor;
   a fifth select gate, a sixth select gate, and a third transistor coupled in series with the fifth and sixth select gates between the second data line and a third memory cell string, wherein the fifth select gate is directly coupled to the sixth select gate, and the sixth select gate is directly coupled to the third transistor; and
a conductive line coupled to a gate of each of the first, second, and third transistors.

2. The apparatus of claim 1, further comprising a control line, wherein the first, second, and third memory cell strings share the control line.

3. The apparatus of claim 1, wherein the conductive line includes a conductive plate of polycrystalline silicon, and the gate of each of the first, second, and third transistors is part of the conductive plate of polycrystalline silicon.

4. The apparatus of claim 1, wherein the conductive line is to receive a voltage during an erase operation of the apparatus in order to generate gate-induced drain leakage current at the transistors during the erase operation.

5. The apparatus of claim 1, wherein the first, second, and third memory strings are included in a same block of memory cells.

6. The apparatus of claim 1, wherein the first, second, and third memory strings are included in different block of memory cells.

7. The apparatus of claim 4, wherein the conductive plate and the select line have different materials.

8. An apparatus comprising:
a first data line and a second data line;
a first select gate, a second select gate, and a first transistor coupled in series with the first and second select gates between the first data line and a first memory cell string;
a third select gate, a fourth select gate, and a second transistor coupled in series with the third and fourth select gates between the first data line and a second memory cell string;
a fifth select gate, a sixth select gate, and a third transistor coupled in series with the fifth and sixth select gates between the second data line and a third memory cell string;
a conductive line coupled to agate of each of the first, second, and third transistors; and
a control line, wherein among the first, second, and third memory cell strings, only the first and second memory cell strings share the control line.

9. An apparatus comprising:
a first data line and a second data line;
a first select gate, a second select gate, and a first transistor coupled in series with the first and second select gates between the first data line and a first memory cell string;
a third select gate, a fourth select gate, and a second transistor coupled in series with the third and fourth select gates between the first data line and a second memory cell string;
a fifth select gate, a sixth select gate, and a third transistor coupled in series with the fifth and sixth select gates between the second data line and a third memory cell string;
a conductive line coupled to a gate of each of the first, second, and third transistors;
a source;
a first additional select gate, and a second additional select gate coupled in series with the first additional select gate between the source the first memory cell string;
a third additional select gate, and a fourth additional select gate coupled in series with the third additional select gate between the source and the second memory cell string; and
a fifth additional select gate, and a sixth additional select gate coupled in series with the fifth additional select gate between the source and the third memory cell string.

10. An apparatus comprising:
a first data line and a second data line;
a first select gate, a second select gate, and a first transistor coupled in series with the first and second select gates between the first data line and a first memory cell string;
a third select gate, a fourth select gate, and a second transistor coupled in series wilt the third and fourth select gates between the first data line and a second memory cell string;
a fifth select gate, a sixth select gate, and a third transistor coupled in series with the fifth and sixth select gates between the second data line and a third memory cell string;
a conductive line coupled to a gate of each of the first, second, and third transistors; and
a select line coupled to the first and fifth select gates, wherein the conductive line includes a conductive plate, and the conductive lines plate has a thickness greater than a thickness of the select line.

11. An apparatus comprising:
a source;
a first select gate, a second select gate, and a first transistor coupled in series with the first and second select gates between the source and a first memory cell string, wherein the first select gate is directly coupled to the second select gate, and the second select gate is directly coupled to the first transistor;
a third select gate, a fourth select gate, and a second transistor coupled in series with the third and fourth select gates between the source and a second memory cell string, wherein the third select gate is directly coupled to the fourth select gate, and the fourth select gate is directly coupled to the second transistor;
a fifth select gate, a sixth select gate, and a third transistor coupled in series with the fifth and sixth select gates between the source and a third memory cell string, wherein the fifth select gate is directly coupled to the sixth select gate, and the sixth select gate is directly coupled to the third transistor; and
a conductive line coupled to a gate of each of the first, second, and third transistors.

12. The apparatus of claim 11, further comprising a control line, wherein the first, second, and third memory cell strings share the control line.

13. The apparatus of claim 11, wherein the conductive line includes a conductive plate of polycrystalline silicon, and the gate of each of the first, second, and third transistors is part of the conductive plate of polycrystalline silicon.

14. The apparatus of claim 11, wherein the conductive line is to receive a voltage during an erase operation of the apparatus in order to generate gate-induced drain leakage current at the transistors during the erase operation.

15. An apparatus comprising:
a source;
a first select gate, a second select gate, and a first transistor coupled in series with the first and second select gates between the source and a first memory cell string;
a third select gate, a fourth select gate, and a second transistor coupled in series with the third and fourth select gates between the source and a second memory cell string;

a fifth select gate, a sixth select gate, and a third transistor coupled in series with the fifth and sixth select gates between the source and a third memory cell string;

a conductive line coupled to a gate of each of the first, second, and third transistors; and a control line, wherein among the first, second, and third memory cell strings, only the first and second memory cell strings share the control line.

16. An apparatus comprising:

a source;

a first select gate a second select gate, and a first transistor coupled in series with the first and second select gates between the source and a first memory cell string;

a third select gate, a fourth select gate, and a second transistor coupled in series with the third and fourth select gates between the source and a second memory cell string;

a fifth select gate, a sixth select gate, and a third transistor coupled in series with the fifth and sixth select gates between the source and a third memory cell string;

a conductive line coupled to a gate of each of the first, second, and third transistors;

a first data line and a second data line;

a first additional select gate, a second select gate, and a first additional transistor coupled in series with the first and second additional select gates between the first data line and the first memory cell string;

a third additional select gate, a fourth additional select gate, and a second additional transistor coupled in series with the third and fourth additional select gates between the first data line and a second memory cell string; and a fifth additional select gate, a sixth additional select gate, and a third additional transistor coupled in series with the fifth and sixth additional select gates between the second data line and a third memory cell string.

17. A method comprising:

applying a first voltage to a first line coupled to a transistor of a memory device during an operation of retrieving information from a memory cell of a memory cell string of the memory device;

applying a second voltage to a second line coupled to a select gate of the memory device during the operation, the transistor and the select gate being coupled in series between the memory cell string and a conductive line of the memory device;

applying a third voltage to the first line during an erase operation of the memory device, the third voltage having a value greater than a value of a supply voltage of the memory device; and placing the second line in a float state during the erase operation.

18. The method of claim 17, further comprising:

applying a fourth voltage to the conductive line during the erase operation, the fourth voltage having a value greater than the value of the third voltage.

19. The method of claim 17, further comprising:

placing the conductive line in a float state during the erase operation.

20. The method of claim 17, further comprising:

placing a third line coupled to an additional select gate in a float state during the erase operation, the additional select gate being coupled in series with the select gate and the transistor between the memory cell string and the conductive line.

* * * * *